(12) United States Patent
Hirose et al.

(10) Patent No.: US 7,777,512 B2
(45) Date of Patent: Aug. 17, 2010

(54) SEMICONDUCTOR DEVICE

(75) Inventors: Masaya Hirose, Kyoto (JP); Kinya Daio, Kyoto (JP); Hiroki Taniguchi, Kyoto (JP); Kazunari Ikeda, Shiga (JP); Takahisa Tokushige, Osaka (JP)

(73) Assignee: Panasonic Corporation, Osaka (JP)

( * ) Notice: Subject to any disclaimer, the term of this patent is extended or adjusted under 35 U.S.C. 154(b) by 154 days.

(21) Appl. No.: 12/042,956

(22) Filed: Mar. 5, 2008

(65) Prior Publication Data
US 2008/0309378 A1      Dec. 18, 2008

(30) Foreign Application Priority Data
Mar. 7, 2007   (JP) .............................. 2007-056778

(51) Int. Cl.
*G01R 31/317*   (2006.01)
*G06F 11/273*   (2006.01)
(52) U.S. Cl. ...................... 324/763; 324/765; 324/158.1
(58) Field of Classification Search ........................ None
See application file for complete search history.

(56) References Cited

U.S. PATENT DOCUMENTS

| | | | |
|---|---|---|---|
| 6,751,079 B2 | 6/2004 | Bretschneider |
| 6,946,846 B2 | 9/2005 | Corr |
| 2002/0196048 A1 | 12/2002 | Sunter |

*Primary Examiner*—Paresh Patel
(74) *Attorney, Agent, or Firm*—Dickinson Wright PLLC

(57) ABSTRACT

A semiconductor device 10a includes a normal circuit 11 and a voltage fluctuation detection circuit 12a connected to a power supply 100 in common with the normal circuit 11. The voltage fluctuation detection circuit 12a includes an inverting amplifier 13a, a switching element 14, which is connected between input and output terminals of the inverting amplifier 13a, and a capacitance element 15 connected to the input terminal of the inverting amplifier 13a. After the normal circuit 11 and the switching element 14 are set to an operating state and ON state, respectively, when the switching element 14 is set to OFF state at an arbitrary time, charge corresponding to a power supply voltage Vc0 at that time accumulates in the capacitance element 15. After the normal circuit 11 is set to a suspended state, a potential VDD of the power supply 100 is set to an arbitrary value, and the inverting amplifier 13a compares the value of a power supply voltage Vc with the voltage value Vc0 corresponding to the charge held in the capacitance element 15.

20 Claims, 21 Drawing Sheets

SEMICONDUCTOR DEVICE

FIELD OF THE INVENTION

The present invention relates to a semiconductor device with a voltage fluctuation detection circuit for detecting fluctuations in power supply voltage caused in a semiconductor chip.

BACKGROUND OF THE INVENTION

When the power supply voltage fluctuates and falls below a certain voltage during operation of a semiconductor chip, such as an LSI, for example, an input/output interface circuit might experience an operational failure. Examples of the cause of a significant reduction in power supply voltage include the following cases: defective design of the semiconductor chip, which causes high current to flow locally, resulting in a voltage drop; and partial disconnection of wiring between a terminal of the power supply and a terminal of the semiconductor chip during packaging, which causes the power supply voltage to drop by more than a design value.

Inspection of the fluctuations in power supply voltage in the semiconductor chip is necessary to confirm whether there is any defect in design of the semiconductor chip, or to analyze any operational failure due to wiring disconnection or suchlike. At present, fluctuations in power supply voltage in the semiconductor chip are detected using a specialized measurement apparatus after processing the semiconductor chip with a specialized processing apparatus to expose its circuit portion and place needles in wired portions.

However, such a detection method takes time to process the semiconductor chip, and requires expensive apparatuses for processing and voltage measurement, resulting in increases in development period and cost of semiconductor devices. Furthermore, the detection method has a problem in that semiconductor chips are processed as samples, hence not usable thereafter.

In view of the circumstances as described above, there is some demand for a device capable of detecting fluctuations in power supply voltage during an operating state of a semiconductor chip without using any specialized apparatuses, while minimizing increases in cost of developing and producing semiconductor chips, as well as enabling reuse of the semiconductor chips used as samples.

To satisfy the aforementioned demand, there has been proposed a semiconductor device having incorporated therein a voltage fluctuation detection device composed of simple circuits (see U.S. Patent Application Publication No. US 20020196048 A1).

FIG. 21 illustrates the configuration of the semiconductor device 50 described in the above prior art document. The semiconductor device 50 includes a normal circuit 51, and a voltage fluctuation detection device 52. The voltage fluctuation detection device 52 includes an inverting amplifier 53 and a latching circuit 54. The inverting amplifier 53 is connected between a terminal 521 for an external power supply 500 that supplies power to the normal circuit 51 and a terminal 522 to which a ground potential VSS is supplied. The latching circuit 54 has a reset terminal connected to an output terminal of the inverting amplifier 53.

Note that the normal circuit 51 refers to one of the circuits included in the semiconductor device 50 that is used during normal operation and has any portions used only for inspection excluded therefrom. In addition, the potential of the external power supply 500 is denoted by VDD, and the power supply voltage of the normal circuit 51 is denoted by Vc. The potential VDD of the external power supply 500 normally shows a constant value, whereas the power supply voltage Vc applied from the external power supply 500 to the normal circuit 51 changes in accordance with the operation of the normal circuit 51. The same applies to the following descriptions.

When detecting the power supply voltage Vc of the normal circuit 51, a reference voltage VDC is supplied from an external power supply (not shown) to an input terminal 55 of the inverting amplifier 53. When the power supply voltage Vc falls below the value of the reference voltage VDC supplied to the terminal 55, an output from the latching circuit 54 is inverted. Accordingly, based on the output from the latching circuit 54, it is possible to detect whether the power supply voltage Vc is below the reference voltage VDC.

According to the conventional semiconductor device as described above, by repeating voltage detection while changing the value of the reference voltage VDC, it becomes possible to detect the range of fluctuations in the power supply voltage Vc during the operation of the normal circuit 51. Therefore, by using the detection results, it becomes possible to eliminate any semiconductor chip that might be defective in terms of operation at the time of product shipment or suchlike.

However, the above conventional device is not capable of detecting the value of the power supply voltage Vc at arbitrary times during the operation of the normal circuit 51. In other words, any fluctuations in power supply voltage over time cannot be detected, and therefore there is a limit in the ability to analyze the behavior of semiconductor devices.

In addition, the above conventional device requires wiring for analog signals because an analog signal is inputted from the terminal 55 as the reference voltage VDC. Since the wiring for analog signals is susceptible to influences of resistance and noise compared to wiring compatible with digital signals, it is necessary to design the device considering such aspects, which leads to a relative increase in size. As a result, the wiring for detecting voltage fluctuations disadvantageously imposes constraints on the design of semiconductor chips.

BRIEF SUMMARY OF THE INVENTION

An object of the present invention is to provide a semiconductor device that is capable of readily detecting the value of the power supply voltage at arbitrary times during the operation of the normal circuit, but does not require any wiring and terminals for analog signals.

To achieve the above object, the present invention provides a semiconductor device comprising:

a normal circuit for use in a normal operation; and a voltage fluctuation detection circuit for detecting fluctuations in a voltage applied from an external power supply to the normal circuit, wherein the voltage fluctuation detection circuit includes:

an inverting amplifier with first and second input terminals and an output terminal, the first input terminal being connected to wiring for connecting the power supply to the normal circuit;

a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied.

Also, the present invention provides a method for testing the semiconductor device, comprising:

a first step of setting the normal circuit to an operating state, and setting the switching element to an ON state;

a second step of shifting the switching element from the ON state to an OFF state at a first arbitrary time; and a third step of shifting the normal circuit from the operating state to a suspended state at a second arbitrary time, and setting a potential of the power supply at an arbitrary value to determine an output signal of the voltage fluctuation detection circuit.

By employing the semiconductor device of the present invention and the method for testing the same, it becomes possible to readily detect the value of the power supply voltage at any arbitrary times during the operation of the normal circuit, which is an advantage in analyzing the semiconductor device operation. In addition, the semiconductor device of the present invention does not require any reference voltage to be inputted, and therefore it is possible to eliminate the necessity of any wiring and terminals for analog signals, and reduce constraints on the design of semiconductor chips.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Hereinafter, embodiments of the present invention will be described with reference to the drawings. Note that in each of the following embodiments, elements with similar functions to those in another embodiment are denoted by the same characters, and any overlapping descriptions thereof will be omitted.

First Embodiment

Figure 1:
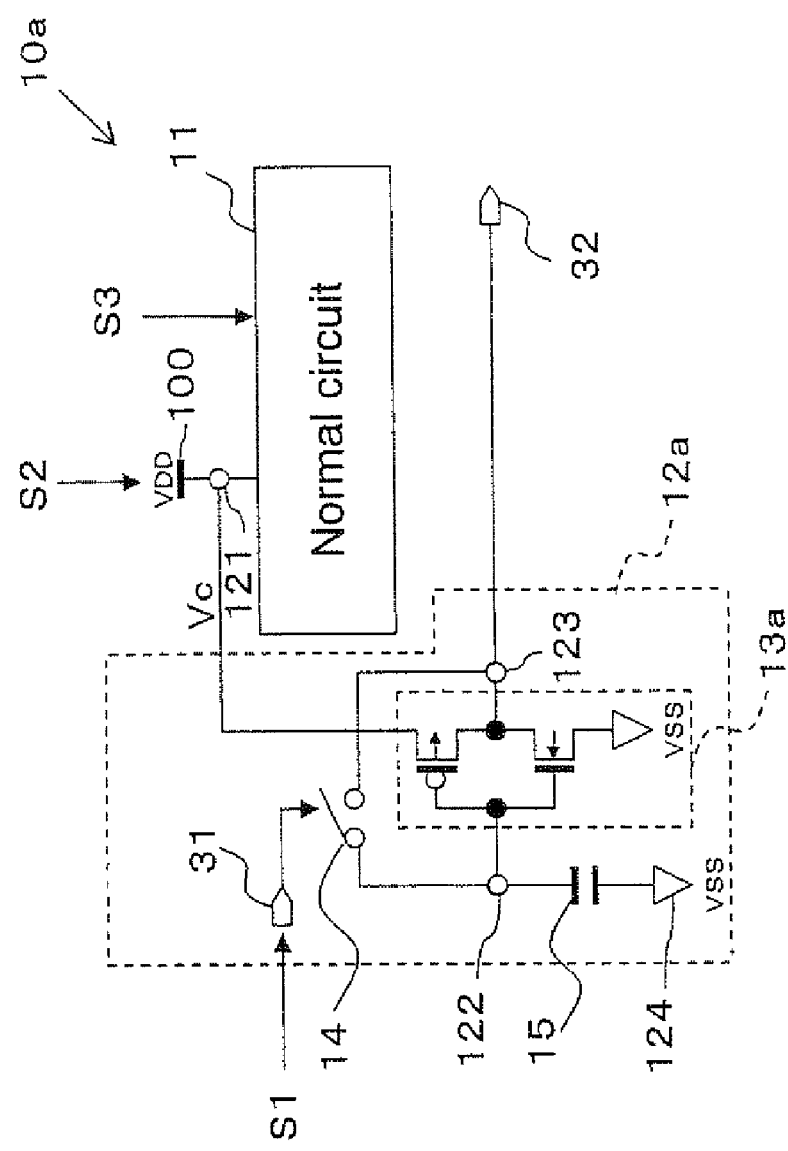
FIG. 1 is a circuit diagram illustrating the configuration of a semiconductor device according to a first embodiment of the present invention.

FIG. 1 illustrates the configuration of a semiconductor device according to a first embodiment of the present invention. The semiconductor device 10a includes a normal circuit 11 and a voltage fluctuation detection circuit 12a, as shown in FIG. 1.

The normal circuit 11 is one of the circuits included in the semiconductor device 10a that is used during normal operation, i.e., the circuit has any portions used only for inspection excluded therefrom. In addition, the normal circuit 11 functions when the semiconductor device 10a is mounted in a final product. The normal circuit 11 is connected to an external power supply (hereinafter, simply referred to as a "power supply") 100 via a power supply terminal (in the figure, terminal 121). The voltage fluctuation detection circuit 12a is also connected to the power supply 100 via the terminal 121 to detect the value of a power supply voltage Vc applied from the power supply 100 to the normal circuit 11.

The voltage fluctuation detection circuit 12a includes an inverting amplifier 13a, a switching element 14, and a capacitance element 15. The inverting amplifier 13a has two input terminals 121 and 122, and one output terminal 123. The first input terminal 121 is connected to the power supply 100 (potential VDD), and the second input terminal 122 is connected to the capacitance element 15. In addition, the switching element 14 is connected between the output terminal 123 and the second input terminal 122 of the inverting amplifier 13a. The capacitance element 15 is connected between the second input terminal 122 of the inverting amplifier 13a and a terminal 124 that is held at a ground potential VSS used as a reference potential.

Note that in the present embodiment, the inverting amplifier 13a consists of, but is not limited to, one P-type MOS transistor and one N-type MOS transistor. Also, in the present embodiment, the first input terminal 121 of the inverting amplifier 13a is connected to a terminal for connecting to the external power supply, but this is not restrictive. The first input terminal 121 may be connected to a part of the wiring extending between the normal circuit 11 and the terminal for connecting to the external power supply. The same applies to the subsequent embodiments.

ON/OFF timing of the switching element 14 can be arbitrarily adjusted by a control means (not shown) provided outside the semiconductor device 10a and connected to a terminal 31.

Figure 2:
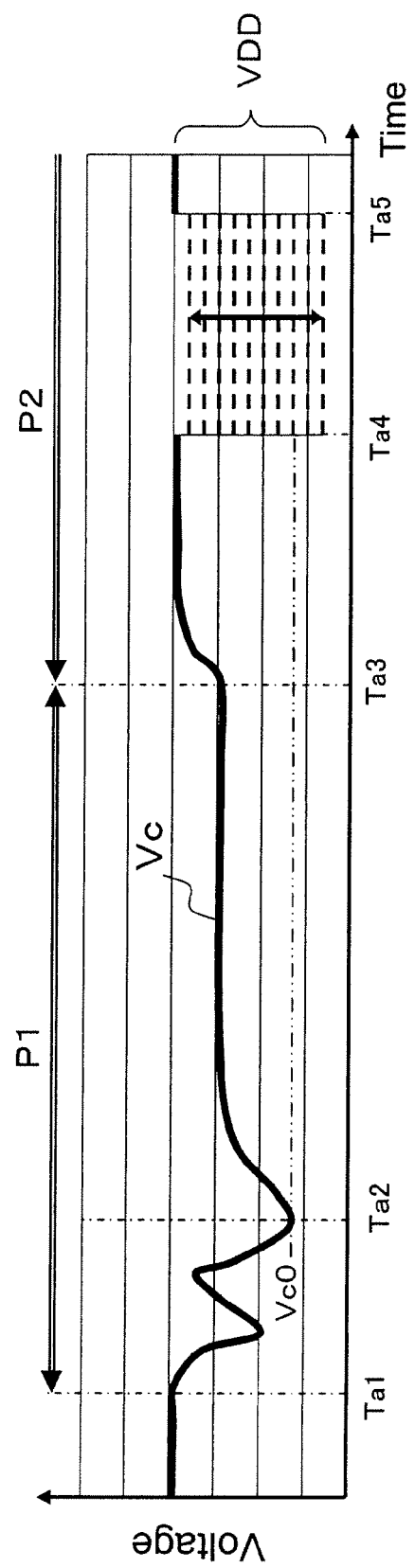
FIG. 2 is a graph for describing a power supply voltage detection method using the semiconductor device according to the first embodiment.
Figure 3A:
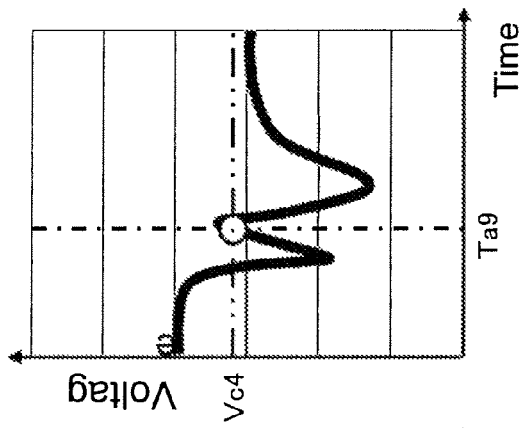
FIGS. 3A to 3D are graphs for describing the power supply voltage detection method using the semiconductor device according to the first embodiment.
Figure 3B:
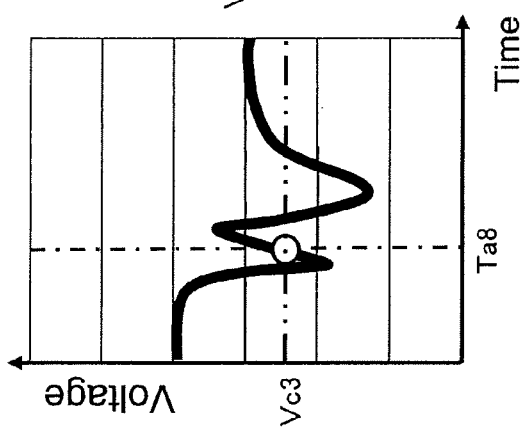
Figure 3C:
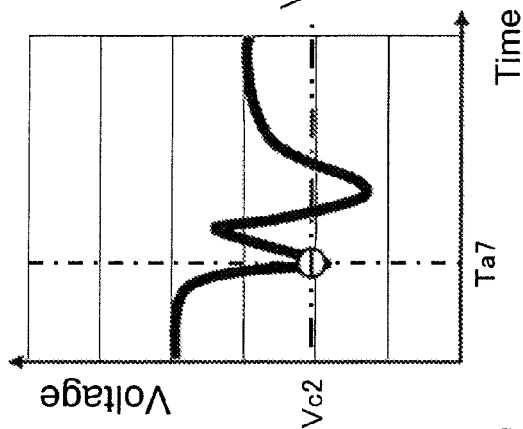
Figure 3D:
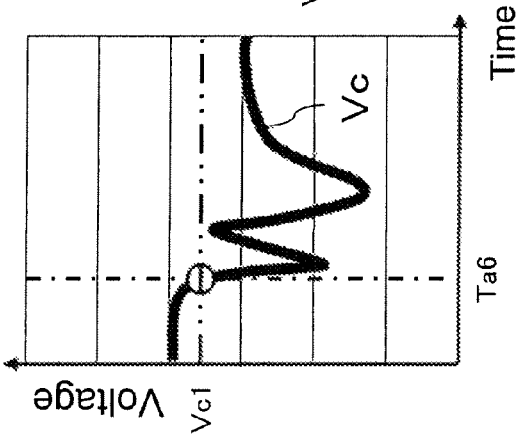

Next, the operation of detecting the power supply voltage Vc by the voltage fluctuation detection circuit 12a will be described with reference to FIG. 2. FIG. 2 is a graph showing the relationship between the power supply voltage Vc (vertical axis) of the semiconductor device 10a and time (horizontal axis). By using the voltage fluctuation detection circuit 12a shown in FIG. 1, the potential of the power supply can be detected at arbitrary times during the operation of the normal circuit 11.

At time Ta1, a control signal S3 from the unillustrated control means is inputted to the normal circuit 11, starting the operation of the normal circuit 11. At this time, the switching element 14 has been previously set to ON state in accordance with a control signal S1 from the unillustrated control means, and therefore charge corresponding to the power supply voltage Vc accumulates in the capacitance element 15. When the power supply voltage Vc fluctuates in accordance with the operation of the normal circuit 11, the amount of charge accumulating in the capacitance element 15 changes in accordance with the fluctuations. At this time, voltages at two ends of the capacitance element 15 are about ½ of the power supply voltage Vc.

When another control signal S1 is inputted from the unillustrated control means to the terminal 31 at time Ta2, the switching element 14 transitions from ON state to OFF state. Charge corresponding to the power supply voltage Vc at time Ta2 accumulates in the capacitance element 15, and thereafter the charge is maintained without depending on the power supply voltage Vc.

Next, based on another control signal S3 from the unillustrated control means, the normal circuit 11 transitions from an operating state to a suspended state at time Ta3. In accordance with this, the amount of current consumed in the normal circuit 11 and the transient current change significantly decrease, so that the power supply voltage Vc of the normal circuit 11 is rendered equivalent to the potential VDD of the power supply 100.

Next, in accordance with a control signal S2 from the unillustrated control means, the potential VDD of the power supply 100 is set at an arbitrary value for a time period from time Ta4 to time Ta5, and an output signal of the voltage fluctuation detection circuit 12a outputted to the terminal 32 is determined.

The second input terminal 122 of the inverting amplifier 13a holds a voltage (about ½ of Vc0) corresponding to the power supply voltage Vc0 at time Ta2. If the potential VDD of the power supply 100 changes, so that the value of the power supply voltage Vc falls below Vc0, the sign (positive/negative) of the output from the voltage fluctuation detection circuit 12a is inverted. Accordingly, at this time, by measuring the value of the potential VDD of the power supply 100 with a tester or suchlike, it is possible to detect the power supply voltage Vc0 at time Ta2.

As described earlier, during the operating period (P1 in FIG. 2) of the normal circuit 11, the power supply voltage Vc changes in accordance with the operation status of the normal circuit 11, whereas during the suspended period (P2 in FIG. 2) of the normal circuit 11, the power supply voltage Vc has almost the same value as the potential VDD of the power supply 100. Accordingly, the potential VDD of the power supply 100 for the semiconductor device 10 is lowered from its maximum rated value during the suspended period P2 of the normal circuit 11, as indicated by the broken lines in the figure, and the value of the potential VDD of the power supply 100 is measured when the output signal of the inverting amplifier 13a is inverted, making it possible to detect the power supply voltage Vc0 at time Ta2 during the operating period P1 of the normal circuit 11, i.e., when the switching element 14 changes from ON state to OFF state.

FIGS. 3A to 3D show the relationships between voltage (vertical axis) and time (horizontal axis) when the operation of detecting the power supply voltage Vc as illustrated in FIG. 2 is repeated while delaying the time Ta at which to change the switching element 14 from ON state to OFF state by a short time period $\Delta T$ (Ta6+$\Delta T$=Ta7, Ta7+$\Delta T$=Ta8, and Ta8+$\Delta T$=Ta9). At times Ta6, Ta7, Ta8, and Ta9, it is possible to measure the values Vc1, Vc2, Vc3, and Vc4, respectively, of the potential VDD of the power supply 100 when the output signal of the voltage fluctuation detection circuit 12a is inverted.

By transferring the values thus measured to a two-dimensional coordinate system of time and voltage, it is possible to make a graph of changes in the power supply voltage Vc over time. Accordingly, by repeating the above-described operation at every interval of $\Delta T$ during a time period from time Ta1 to time Ta3, it is possible to make a graph of changes in the power supply voltage Vc during the operating period P1 of the normal circuit 11.

By employing the above-described power supply voltage detection method as a semiconductor device testing method, it becomes possible to detect the power supply voltage Vc at arbitrary times during the operating period of the normal circuit 11. In addition, by repeating voltage detection at different times, it becomes possible to make a graph of changes in the power supply voltage. Moreover, the voltage detection method in the present embodiment does not require any physical processing of the semiconductor device, and therefore the semiconductor device can be used again after inspection.

In addition, the above-described voltage detection method does not require any dedicated reference voltage to be inputted, and any voltage to be referenced is inputted using existing wiring for power supply, thereby eliminating the necessity of any wiring for analog voltage inputs. The semiconductor device in the present embodiment can be readily and efficiently mounted on the semiconductor chip.

Second Embodiment

Figure 4:
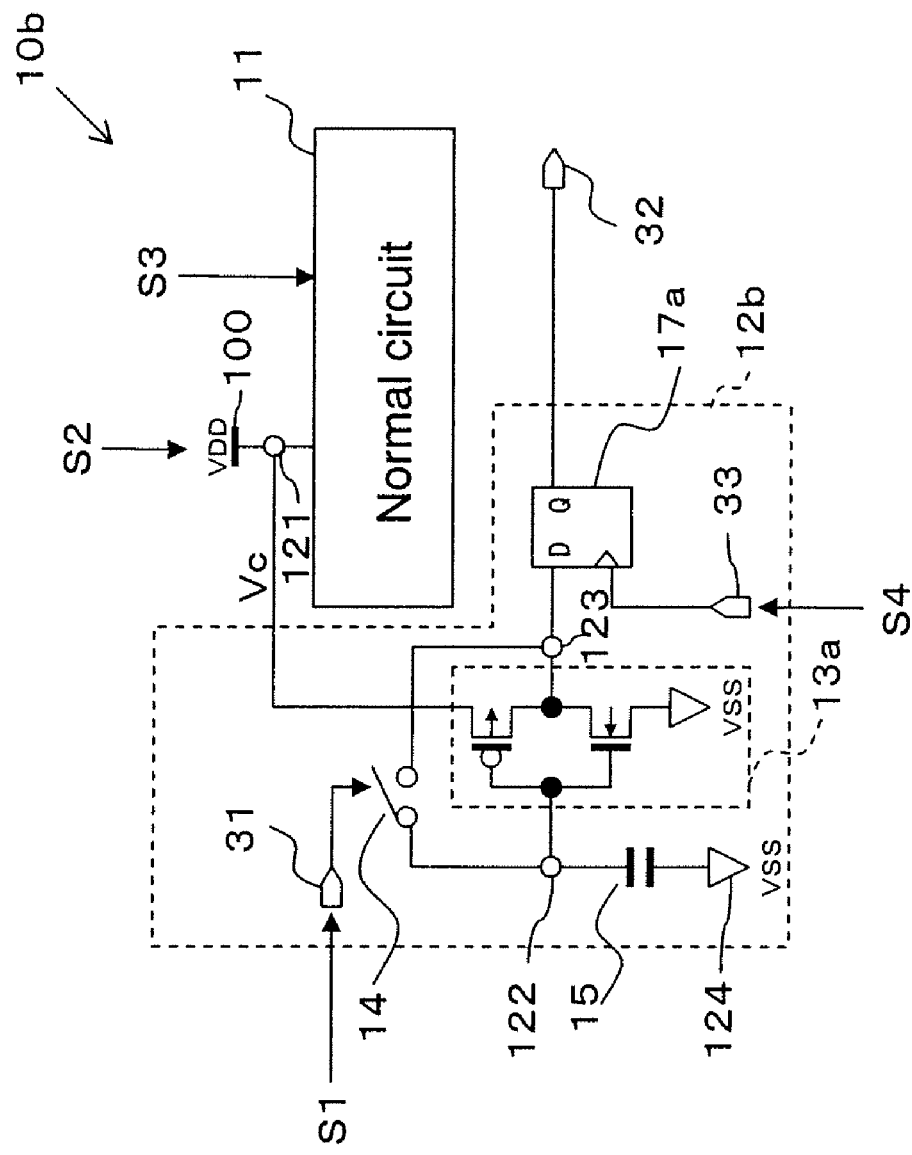
FIG. 4 is a circuit diagram illustrating the configuration of a semiconductor device according to a second embodiment of the present invention.

FIG. 4 illustrates the configuration of a semiconductor device according to a second embodiment of the present invention. The semiconductor device 10b in FIG. 4 includes a voltage fluctuation detection circuit 12b, in place of the voltage fluctuation detection circuit 12a. The voltage fluctuation detection circuit 12b is configured by adding a holding circuit 17a as a subsequent stage of the inverting amplifier 13a included in the voltage fluctuation detection circuit 12a.

As described in the first embodiment, it is possible to make a graph of fluctuations in the power supply voltage during the operating period of the normal circuit 11 by using the voltage fluctuation detection circuit 12a shown in FIG. 1. However, to detect the power supply voltage Vc at the arbitrary time Ta2, it is necessary to change the potential VDD of the power supply 100 during the suspended period P2 of the normal circuit 11.

In the case of the configuration in FIG. 1, leakage current appears in the capacitance element 15, and therefore the voltages held at the two ends of the capacitance element 15 drop over time. Accordingly, when it takes time to change the potential VDD of the power supply 100, the voltages at the two ends of the capacitance element 15 drop during that time, causing errors in detection of the power supply voltage Vc. The errors in detection of the power supply voltage Vc are negligible when the value of the leakage current is low, but the reliability of detection results for the power supply voltage Vc deteriorates when the value of the leakage current is high.

In the present embodiment, this problem is solved by adding the holding circuit 17a as a subsequent stage of the inverting amplifier 13a. Concretely, the time period from T4a to T5a, in which to change the potential VDD of the power supply 100 within the suspended period of the normal circuit 11, is set to be a predetermined short period after time Ta2 at which the switching element 14 is set to OFF state. During this period, an output timing control signal S4 is inputted from the unillustrated control means to a terminal 33 of the holding circuit 17a, and an output from the inverting amplifier 13a at that time is held as an output from the holding circuit 17a. At this time, if the output from the inverting amplifier 13a is positive, the value "1" is outputted to an output terminal 32 of the holding circuit 17a, and when the output from the inverting amplifier 13a changes to negative, the output from the holding circuit 17a changes to "0", and this value is held.

With the time Ta2 at which to change the switching element 14 from ON state to OFF state being fixed, the operation of determining the output from the holding circuit 17a is repeated while lowering the potential VDD of the power supply 100 from its maximum rated value, as indicated by the broken lines in FIG. 2. Then, the value of the potential VDD of the power supply 100 is measured when the output from the holding circuit 17a is inverted. During the operating period P1 of the normal circuit 11, the above-described process is repeated while changing the value of time Ta2 by ΔT.

Figure 5B:
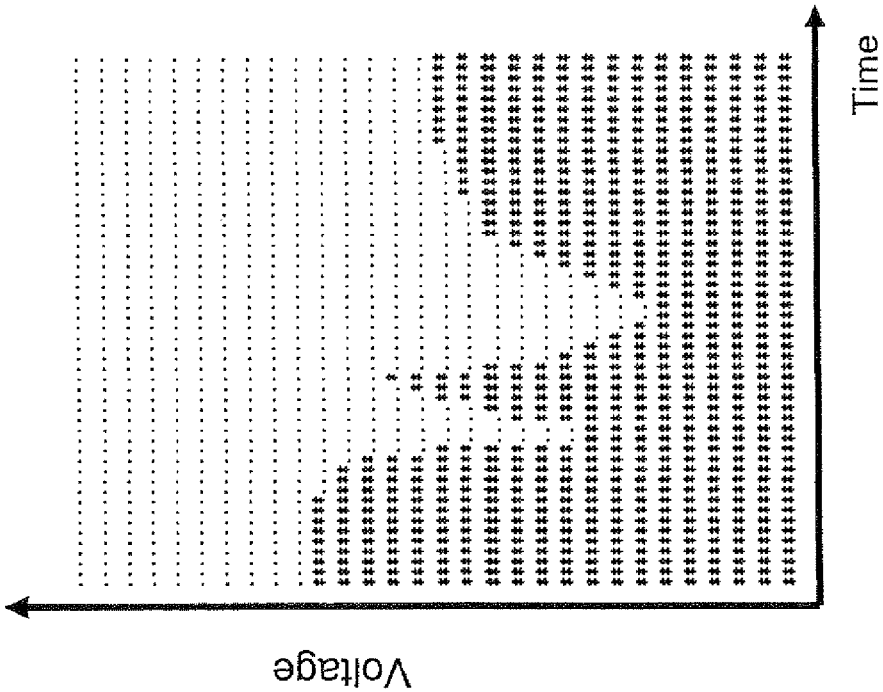
FIGS. 5A and 5B are graphs for describing a power supply voltage detection method using the semiconductor device according to the second embodiment.
Figure 5A:
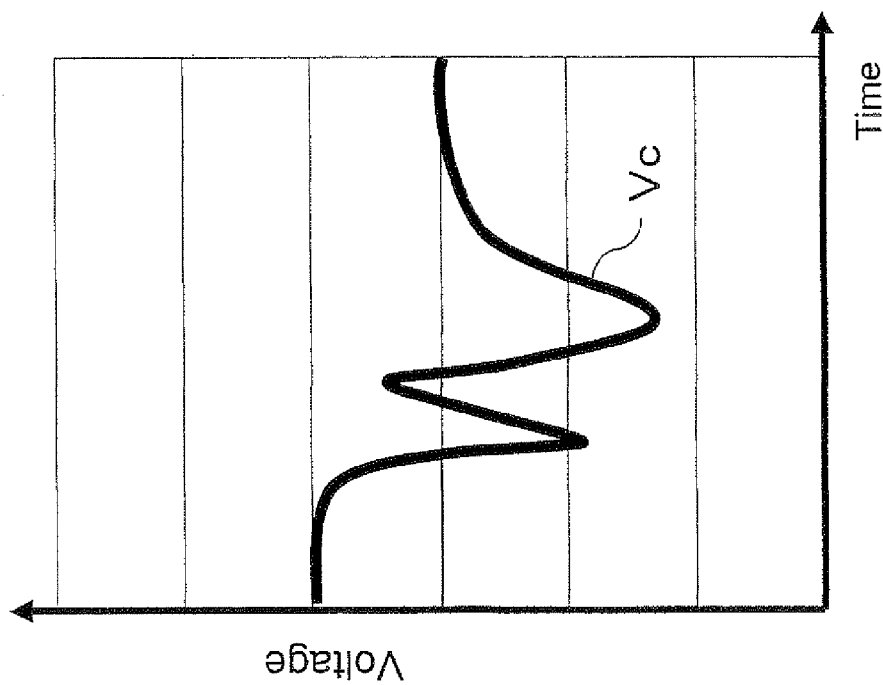

FIG. 5A shows changes in the power supply voltage Vc during the operating period of the normal circuit 11, and FIG. 5B shows a graph representing determination results obtained by the voltage fluctuation detection circuit 12b. In FIG. 5B, the "*" marks denote the values of the potential VDD of the power supply 100 at times when the output of the holding circuit 17a is inverted. By using the voltage fluctuation detection circuit in the present embodiment, it becomes possible to detect fluctuations in the power supply voltage with high accuracy and make a graph free of any influence from the leakage current in the capacitance element 15.

Third Embodiment

Figure 6:
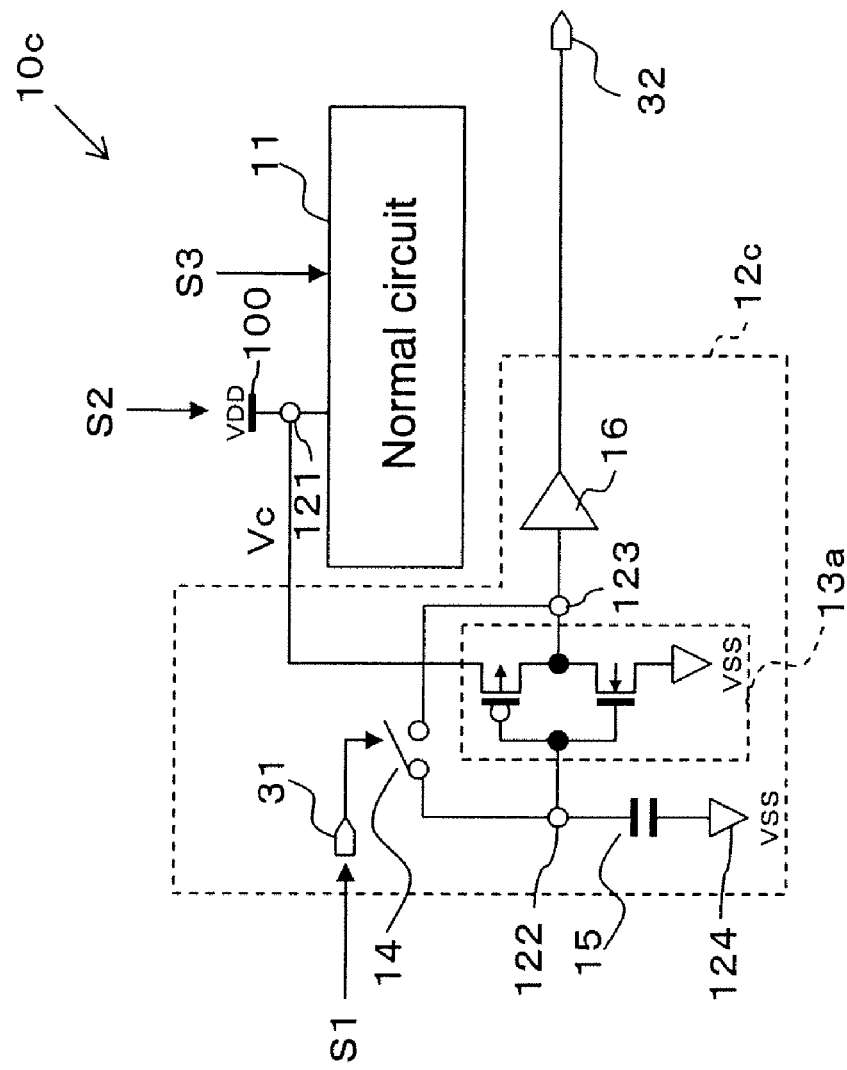
FIG. 6 is a circuit diagram illustrating the configuration of a semiconductor device according to a third embodiment of the present invention.

FIG. 6 illustrates the configuration of a semiconductor device according to a third embodiment of the present invention. The semiconductor device 10c in FIG. 6 includes a voltage fluctuation detection circuit 12c, in place of the voltage fluctuation detection circuit 12a included in the semiconductor device 10a in FIG. 1. The voltage fluctuation detection circuit 12c is configured by connecting an amplifier 16 as a subsequent stage of the inverting amplifier 13a included in the voltage fluctuation detection circuit 12a.

The voltage fluctuation detection circuit 12c has a larger circuit scale than the voltage fluctuation detection circuit according to the configuration in FIG. 1, but it has an advantage in that smaller voltages can be determined because the output voltage of the inverting amplifier 13a is amplified.

Fourth Embodiment

Figure 7:
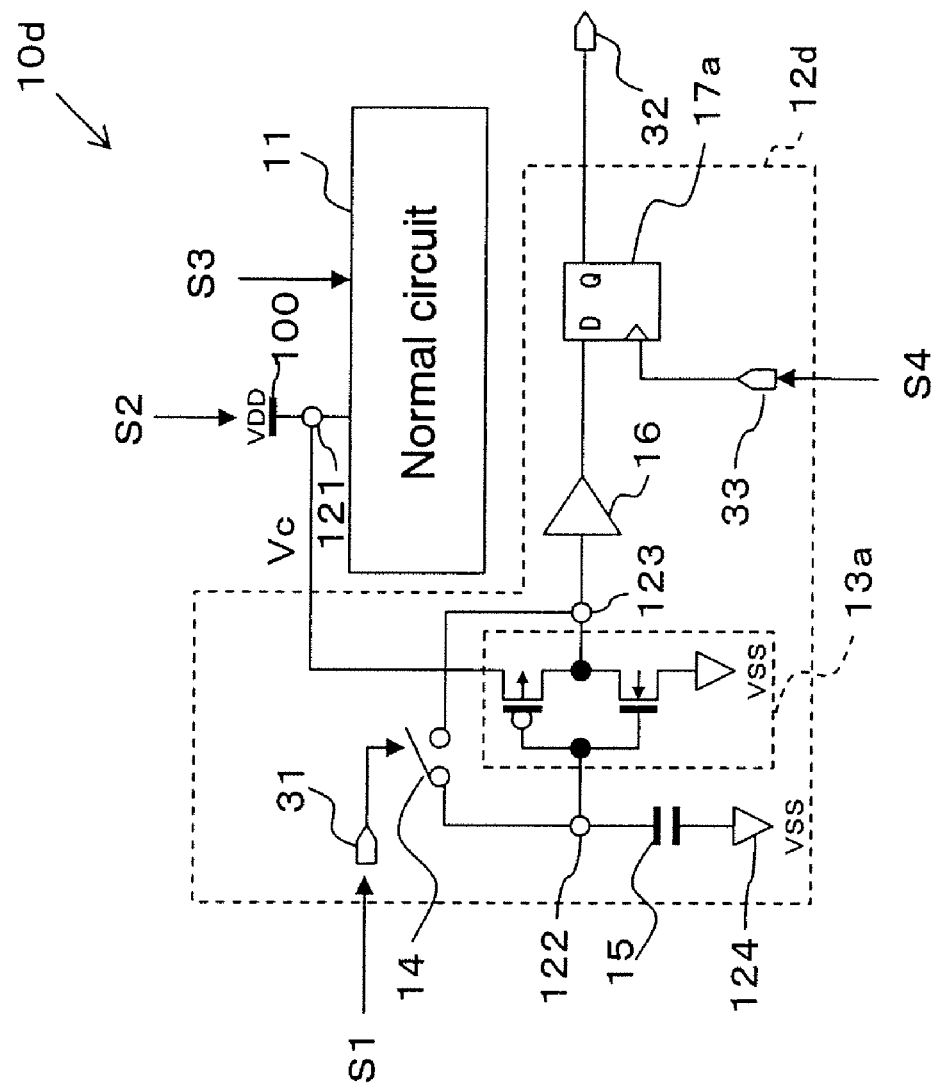
FIG. 7 is a circuit diagram illustrating the configuration of a semiconductor device according to a fourth embodiment of the present invention.

FIG. 7 illustrates the configuration of a semiconductor device according to a fourth embodiment of the present invention. The semiconductor device 10d in FIG. 7 includes a voltage fluctuation detection circuit 12d, in place of the voltage fluctuation detection circuit 12b included in the semiconductor device 10b in FIG. 4. The voltage fluctuation detection circuit 12d is configured by connecting an amplifier 16 between the inverting amplifier 13a and the holding circuit 17a included in the voltage fluctuation detection circuit 12b.

In the case of the configuration in FIG. 7, the voltage fluctuation detection circuit 12d has an increased circuit scale, but smaller voltages can be determined as in the third embodiment 3. As a result, it is possible to enhance the accuracy in making a graph of fluctuations in the power supply voltage of the normal circuit 11.

Fifth Embodiment

Figure 8:
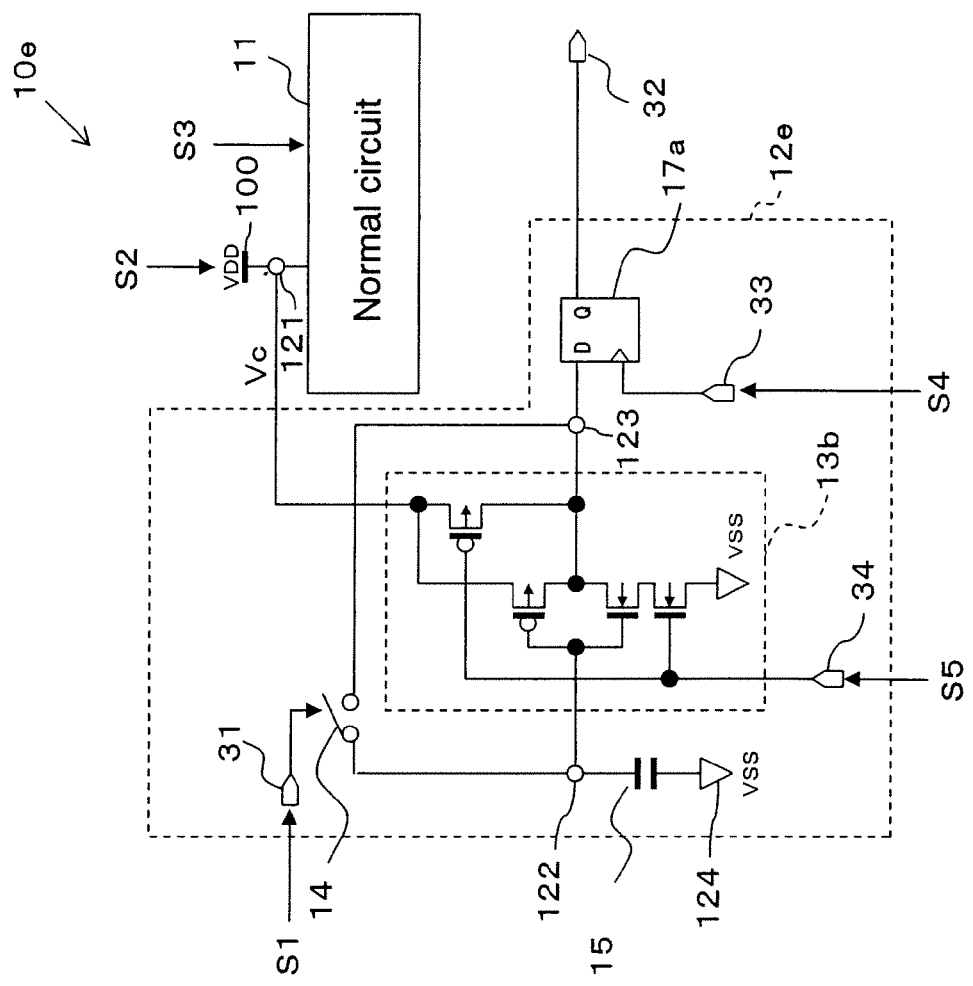
FIG. 8 is a circuit diagram illustrating the configuration of a semiconductor device according to a fifth embodiment of the present invention.

FIG. 8 illustrates the configuration of a semiconductor device according to a fifth embodiment of the present invention. The semiconductor device 10e in FIG. 8 includes a voltage fluctuation detection circuit 12e, in place of the voltage fluctuation detection circuit 12b included in the semiconductor device 10b in FIG. 4. The voltage fluctuation detection circuit 12e has an inverting amplifier 13b configured differently from the inverting amplifier 13a in FIG. 4.

In the present embodiment, the inverting amplifier 13b is configured as an NAND circuit by combining two P-type MOS transistors and two N-type MOS transistors. In addition, the inverting amplifier 13b is provided with an input terminal 34 for an output fixing control signal S5.

When a "HIGH" signal is inputted from the unillustrated control means to the terminal 34 as the output fixing control signal S5, the inverting amplifier 13b functions in a similar manner to the inverting amplifier 13a in FIG. 4. On the other hand, when a "LOW" signal is inputted to the terminal 34 as the output fixing control signal S5, the inverting amplifier 13b does not function as an inverting amplifier.

Accordingly, by changing the value of the control signal S5 to be inputted to the terminal 34, it becomes possible to exert or stop the function of the voltage fluctuation detection circuit 12e. Note that the same effect can be achieved not only when the output from the inverting amplifier 13b is fixed at the same potential as that of the power supply but also when it is the same as the ground potential or in a high-impedance state.

Sixth Embodiment

Figure 9:
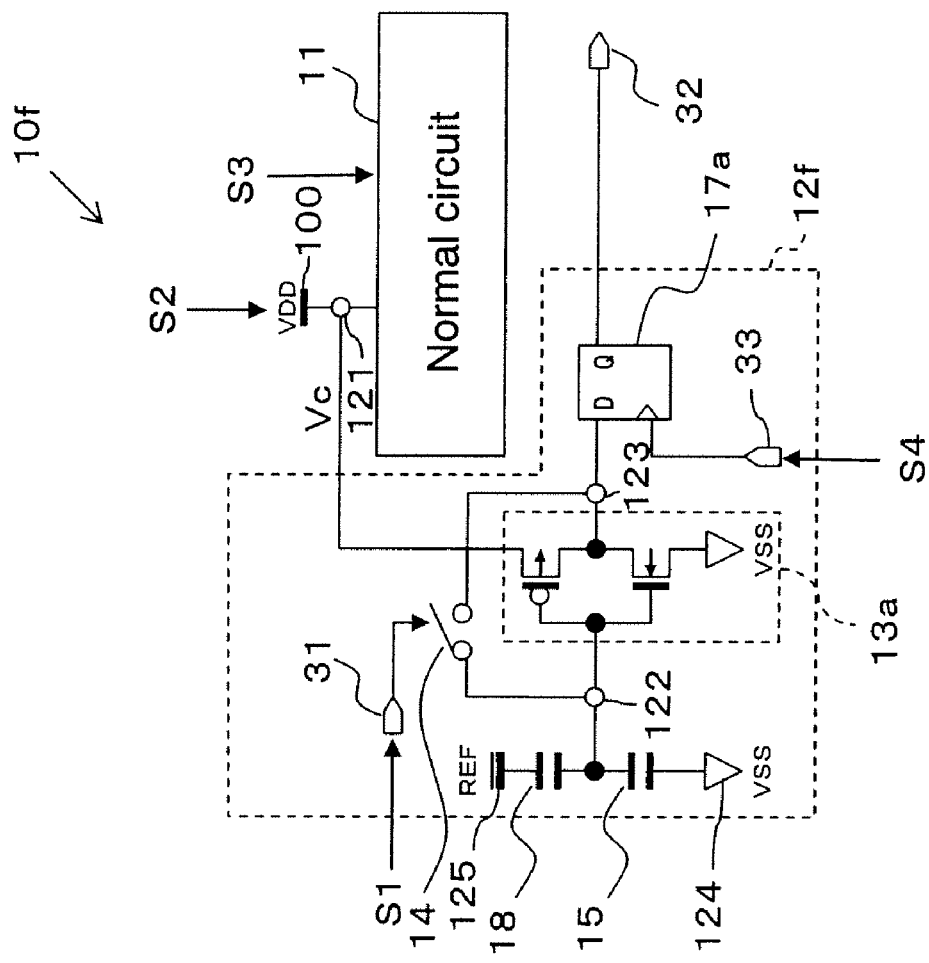
FIG. 9 is a circuit diagram illustrating the configuration of a semiconductor device according to a sixth embodiment of the present invention.

FIG. 9 illustrates the configuration of a semiconductor device according to a sixth embodiment of the present invention. The semiconductor device 10f in FIG. 9 includes a voltage fluctuation detection circuit 12f, in place of the voltage fluctuation detection circuit 12b included in the semiconductor device 10b in FIG. 4. The voltage fluctuation detection circuit 12f differs from the voltage fluctuation detection circuit 12b in that it additionally has a second capacitance element 18 connected to a power supply 125 for supplying a reference potential REF, via an unillustrated terminal.

The capacitance elements 15 and 18 are each connected at one terminal to the second input terminal 122 of the inverting amplifier 13a. The capacitance element 15 is connected at the other terminal to a terminal 124 to which the ground potential VSS of the semiconductor device is supplied. On the other hand, the capacitance element 18 is connected at the other terminal to the power supply 125 for supplying the reference potential REF. By employing the voltage fluctuation detection circuit 12f thus configured, it also becomes possible to achieve effects similar to those achieved by the second embodiment.

Note that the reference potential REF may be supplied from inside or outside the semiconductor device, and the same effects can be achieved even when the reference potential REF is the same as the ground potential VSS of the semiconductor device.

Seventh Embodiment

Figure 10:
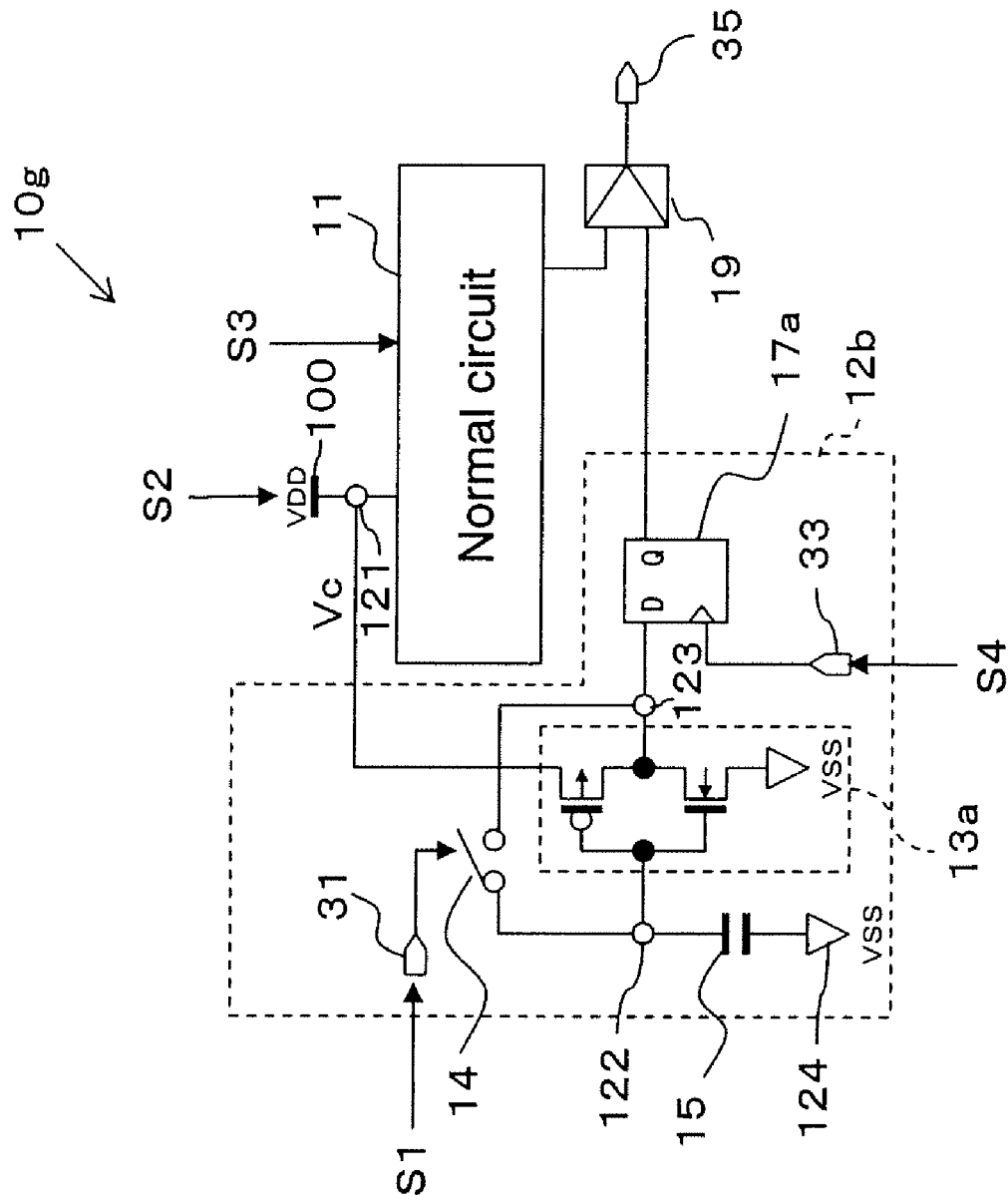
FIG. 10 is a circuit diagram illustrating the configuration of a semiconductor device according to a seventh embodiment of the present invention.

FIG. 10 illustrates the configuration of a semiconductor device according to a seventh embodiment of the present invention. The semiconductor device 10g in FIG. 10 differs from the semiconductor device 10b in FIG. 4 in that it additionally has an output signal switching circuit 19. The normal circuit 11 and the voltage fluctuation detection circuit 12b are connected at their respective output terminals to an input terminal of the output signal switching circuit 19, and an output from either the normal circuit 11 or the voltage fluctuation detection circuit 12b is outputted to a combined output terminal 35.

In the present embodiment, an output terminal for outputting a predetermined signal for the normal operation during the operation of the normal circuit 11 is combined with an output terminal for outputting output results of the voltage fluctuation detection circuit 12b, and therefore it is possible to reduce the number of output terminals for inspection.

Eighth Embodiment

By using the voltage fluctuation detection circuit of the present invention, it becomes possible to detect fluctuations in the power supply voltage during the operating state of the normal circuit 11 with high accuracy, as described in the second embodiment. In addition, by analyzing the behavior of the semiconductor device based on detection results, it becomes possible to determine the range of the power supply voltage that is unlikely to cause any failure, i.e., the tolerable range of the power supply voltage.

In some semiconductor devices, the power supply voltage might fall below the lower limit of the tolerable voltage range due to variations among semiconductor devices caused during the production stage. In addition, any defect in packaging might result in partial disconnection of the wiring connected to the power supply terminal, causing the power supply voltage to fall below the lower limit of the tolerable voltage range. To secure product quality, it is important to exclude any such device with the power supply voltage that might fall below the lower limit of the tolerable voltage range during inspection for semiconductor device shipment. In the present embodiment, a voltage fluctuation detection circuit suitable for such inspection for shipment is provided.

Figure 11:
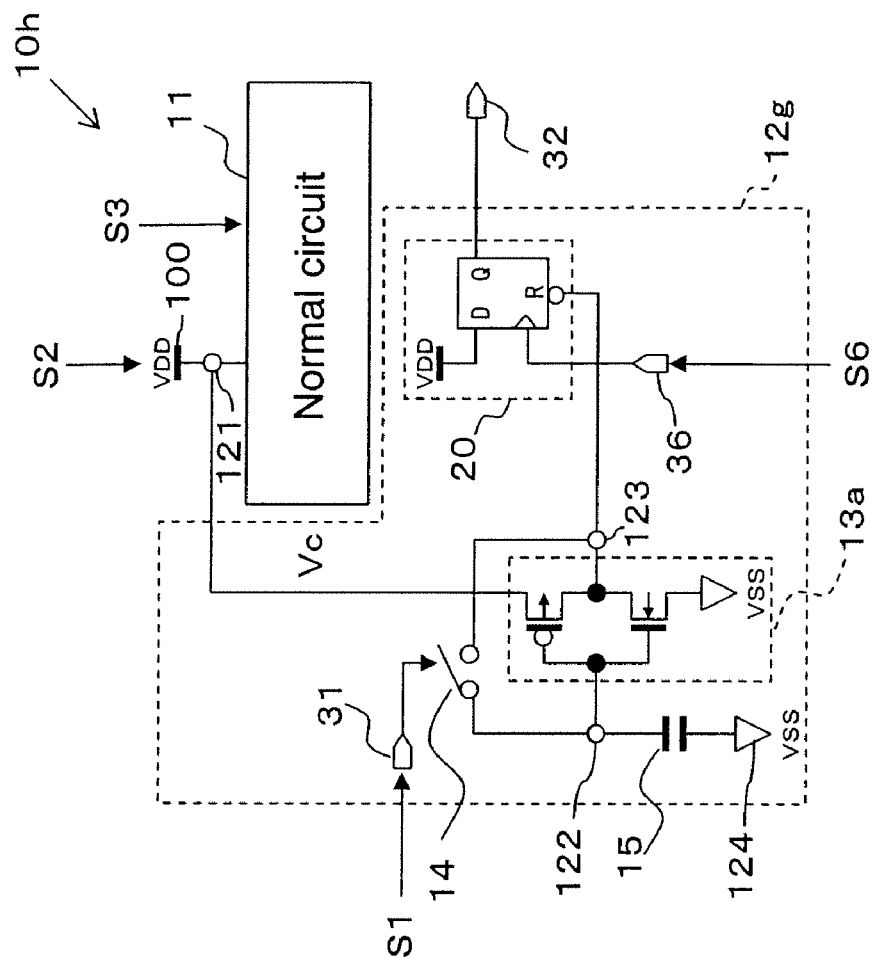
FIG. 11 is a circuit diagram illustrating the configuration of a semiconductor device according to an eighth embodiment of the present invention.

FIG. 11 illustrates the configuration of a semiconductor device according to the present embodiment. The semiconductor device 10h in FIG. 11 includes a voltage fluctuation detection circuit 12g, in place of the voltage fluctuation detection circuit 12a included in the semiconductor device 10a in FIG. 1. The voltage fluctuation detection circuit 12g is configured by adding a latching circuit 20 as a subsequent stage of the inverting amplifier 13a included in the voltage fluctuation detection circuit 12a, such that an output from the inverting amplifier 13a is inputted to a reset terminal of the latching circuit 20.

Figure 12:
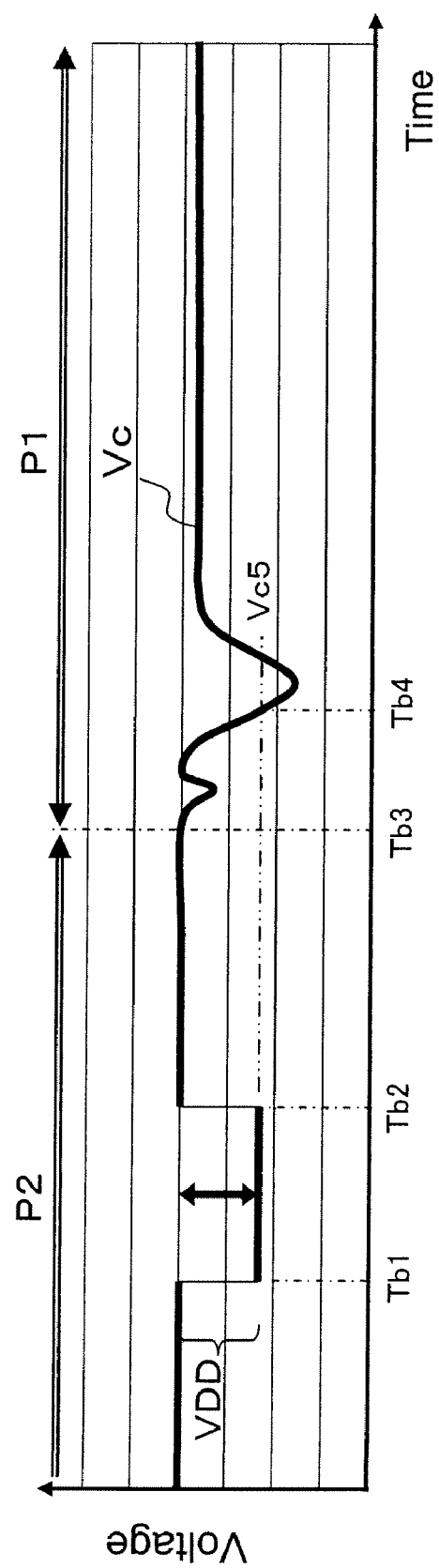
FIG. 12 is a graph for describing a power supply voltage detection method using the semiconductor device according to the eighth embodiment.

Next, the operation of measuring the power supply voltage Vc using the voltage fluctuation detection circuit 12g will be described with reference to FIG. 12. FIG. 12 is a graph showing the relationship between the power supply voltage Vc (vertical axis) of the semiconductor device 10h and time (horizontal axis).

In the present embodiment, unlike in the first embodiment illustrated in FIG. 2, the normal circuit 11 is initially set to the suspended state in accordance with the signal S3 from the unillustrated control means. Similarly, the switching element 14 is set in ON state in accordance with the signal S1 from the unillustrated control means. Furthermore, an output from the latching circuit 20 is set at an output level different from the time at which a reset signal is inputted, in accordance with a control signal S6 inputted from the unillustrated control means to a terminal 36.

During the suspended period P2, the amount of current consumed in the normal circuit 11 and the transient current change significantly decrease, and therefore the potential VDD of the power supply 100 and the power supply voltage Vc of the normal circuit 11 show almost the same value. In accordance with the control signal S2 from the unillustrated control means, the power supply potential VDD is set at the lower limit Vc5 of the above-described tolerable voltage range during a time period from time Tb1 to time Tb2. Charge corresponding to the power supply voltage Vc5 accumulates in the capacitance element 15.

The switching element 14 transitions from ON state to OFF state at any arbitrary time during the period from time Tb1 to time Tb2 in accordance with the control signal S1 from the unillustrated control means. The charge corresponding to the power supply voltage Vc5 accumulates in the capacitance element 15, and thereafter it is maintained without depending on the power supply voltage Vc.

Next, when the control signal S3 is inputted from the unillustrated control means to the normal circuit 11 at time Tb3, the normal circuit 11 transitions from the suspended state to the operating state. After the normal circuit 11 operates during an arbitrary time period (P1), a signal outputted from the latching circuit 20 is determined by an unillustrated determination means connected to the terminal 32.

When the power supply voltage Vc drops below the tolerable voltage value Vc5 (in FIG. 12, at time Tb4) during the operating period P1 of the normal circuit 11, the output from the inverting amplifier 13a is inverted to reset the latching circuit 20, so that the output from the latching circuit 20 changes with its sign (positive/negative) switching from the initially set sign.

As such, it is possible to detect whether the power supply voltage Vc drops below the tolerable voltage Vc5 during the operation period P1 of the normal circuit 11. Any semiconductor device with the power supply voltage Vc below the tolerable voltage Vc5 is considered unable to ensure its normal performance, and therefore some action is taken, e.g., cessation of shipment.

By employing the power supply voltage detection method described in the present embodiment as a semiconductor device testing method, it becomes possible to screen out any semiconductor devices below the lower limit of the tolerable voltage range in a short period of time, resulting in efficient inspection for shipment.

Ninth Embodiment

Figure 13:
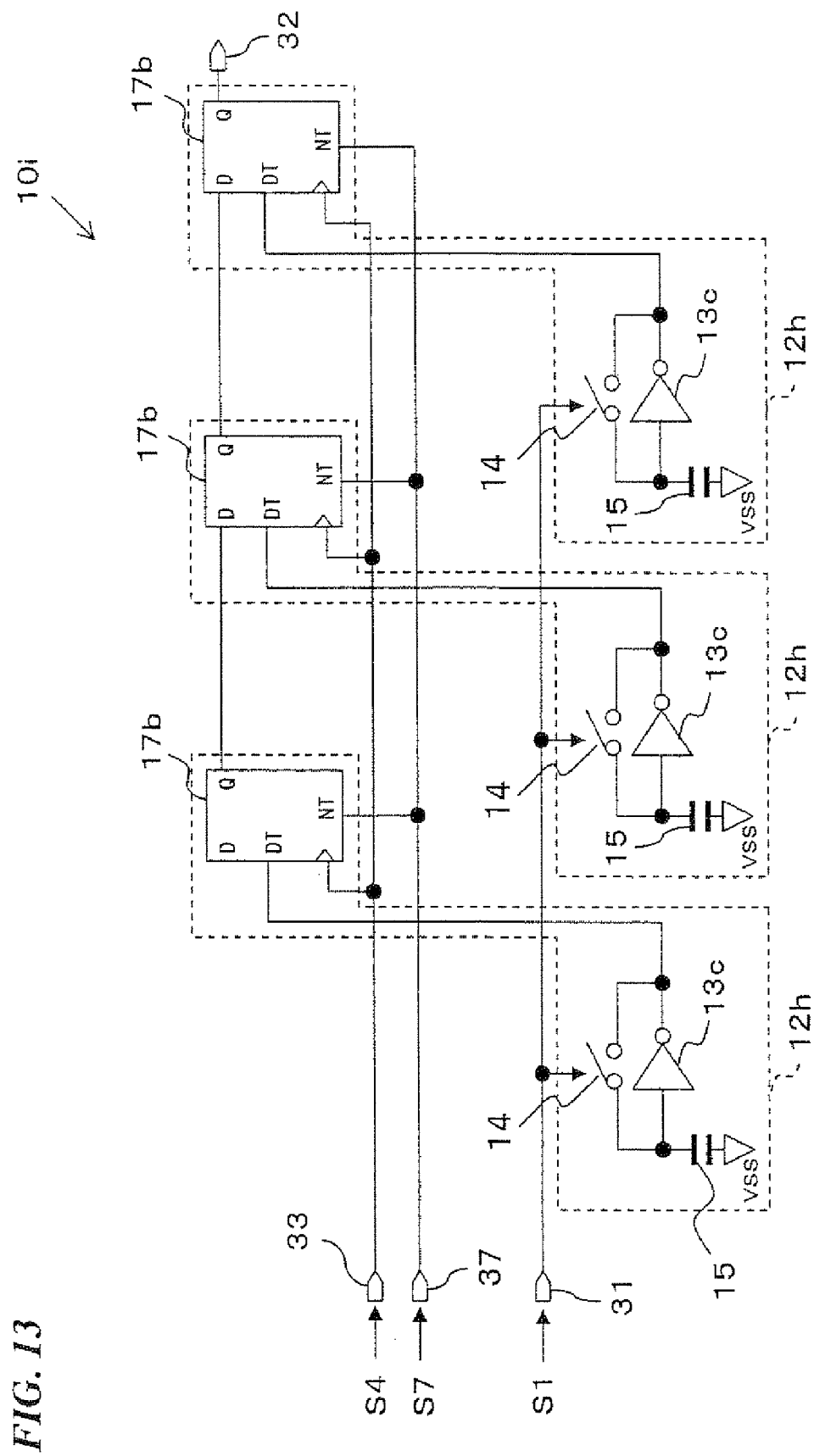
FIG. 13 is a circuit diagram illustrating the configuration of a semiconductor device according to a ninth embodiment of the present invention.

FIG. 13 illustrates the configuration of a semiconductor device according to a ninth embodiment of the present invention. The semiconductor device $10i$ in the present embodiment includes a plurality of voltage fluctuation detection circuits $12h$ connected in a series via their respective holding circuits $17b$. The function of each voltage fluctuation detection circuit $12h$ is not particularly different from the function of the voltage fluctuation detection circuit $12b$ illustrated in FIG. 4. In addition, each inverting amplifier $13c$ has a similar function to the inverting amplifier $13a$, and each holding circuit $17b$ also has a similar function to the holding circuit $17a$.

Note that each inverting amplifier $13c$ is connected to the potential VDD of the power supply 100 in common with the normal circuit 11, but in order to avoid complication, the normal circuit 11 and any wiring connecting the normal circuit 11 to the inverting amplifier $13c$ are omitted in the figure.

The holding circuits $17b$ are flip-flops for scan testing connected in a series. When a scan test control signal S7 is inputted from a terminal 37, output values of the inverting amplifiers $13c$, i.e., output results of the voltage fluctuation detection circuit $12h$, are sequentially outputted from the output terminal 32 via their respective flip-flops.

With the configuration of the present embodiment, the flip-flops for scan testing are utilized to sequentially output the respective detection results obtained from the voltage fluctuation detection circuits $12h$, making it possible to reduce the number of output signal lines for inspection.

Tenth Embodiment

Figure 14:
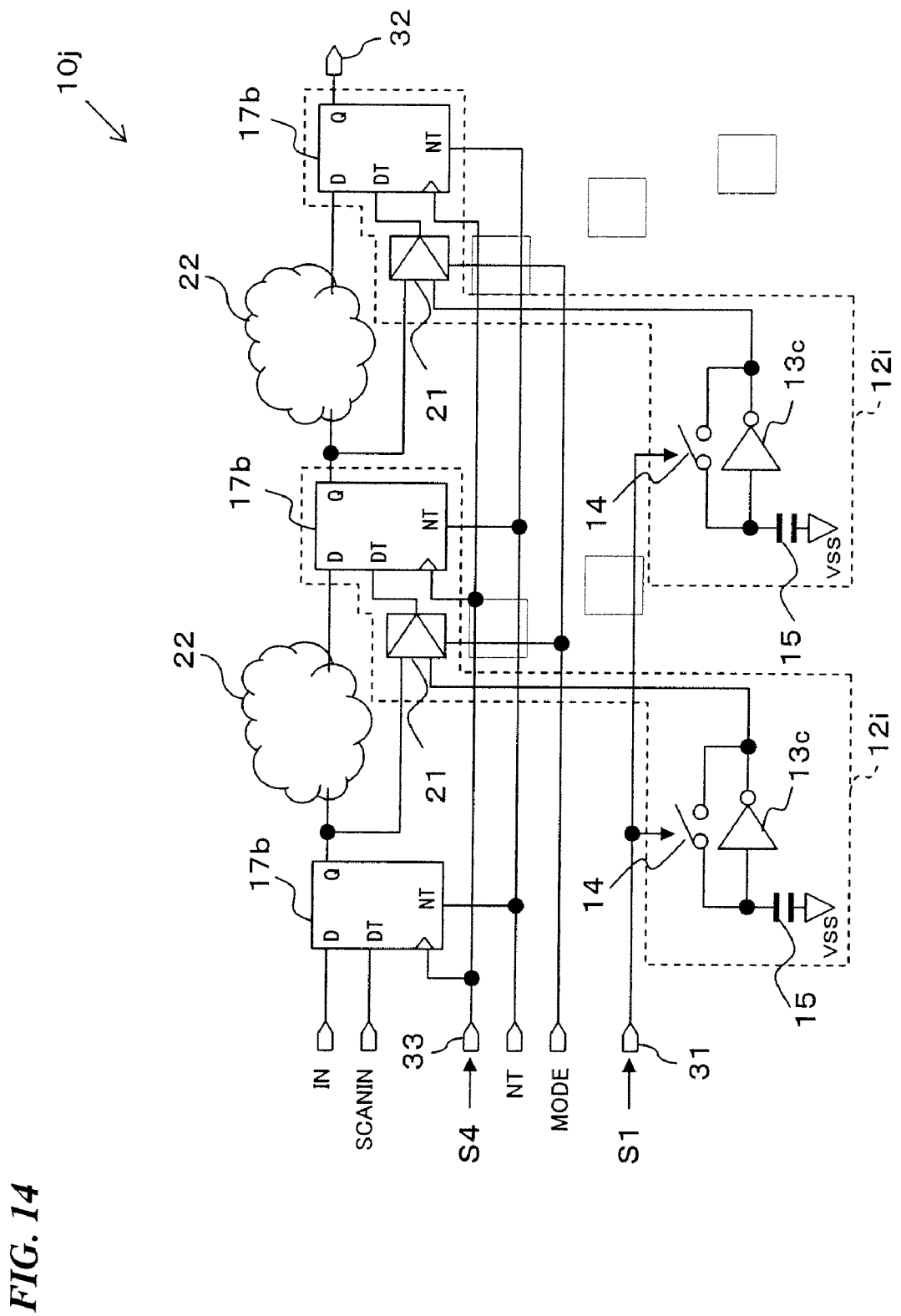
FIG. 14 is a circuit diagram illustrating the configuration of a semiconductor device according to a tenth embodiment of the present invention.

FIG. 14 illustrates the configuration of a semiconductor device according to a tenth embodiment of the present invention. The semiconductor device $10j$ in the present embodiment includes a plurality of voltage fluctuation detection circuits $12i$ connected in a series. As in the ninth embodiment, the function of each voltage fluctuation detection circuit $12i$ is not particularly different from the function of the voltage fluctuation detection circuit $12b$ illustrated in FIG. 4. A random logic 22 is connected between each of the holding circuits $17b$.

The flip-flops acting as the holding circuits $17b$ are used in both inspection of the normal circuit and scan testing, and each of them is switched between use as a scan test circuit and use as the voltage fluctuation detection circuit by a selector 21.

According to the present embodiment, the flip-flops for use in inspection of the normal circuit and the wiring for scan testing are diverted to other purposes, making it possible to reduce the number of circuits and signal lines dedicated to inspection.

Eleventh Embodiment

Figure 15:
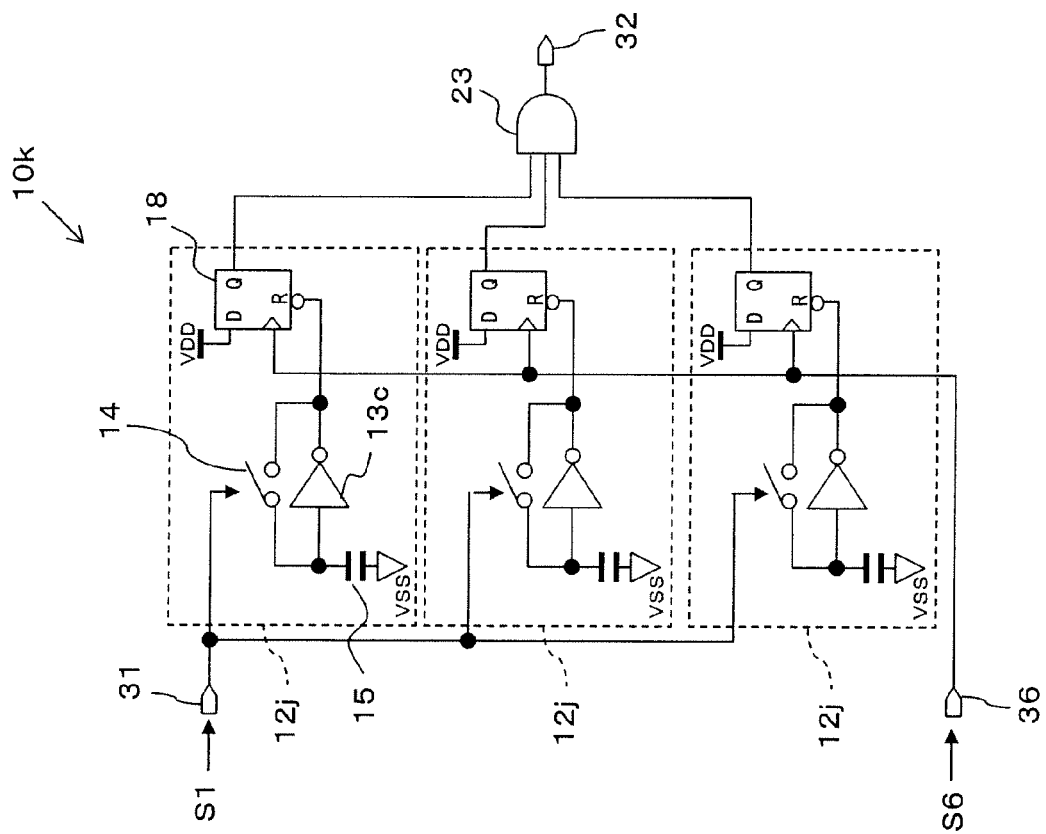
FIG. 15 is a circuit diagram illustrating the configuration of a semiconductor device according to an eleventh embodiment of the present invention.

FIG. 15 illustrates the configuration of a semiconductor device according to an eleventh embodiment of the present invention. The semiconductor device $10k$ according to the present embodiment includes a plurality of voltage fluctuation detection circuits $12j$ connected in parallel. The function of each voltage fluctuation detection circuit $12j$ is not particularly different from the function of the voltage fluctuation detection circuit $12g$ illustrated in FIG. 11. An output terminal of each voltage fluctuation detection circuit $12j$ is connected to an input terminal of an AND circuit 23, so that output results from the voltage fluctuation detection circuits $12j$ can be determined based on only one output from the AND circuit 23.

According to the present embodiment, the AND circuit 23 outputs one result comprising detection results from the voltage fluctuation detection circuits $12j$, making it possible to reduce the number of output signal lines.

Twelfth Embodiment

Figure 16:
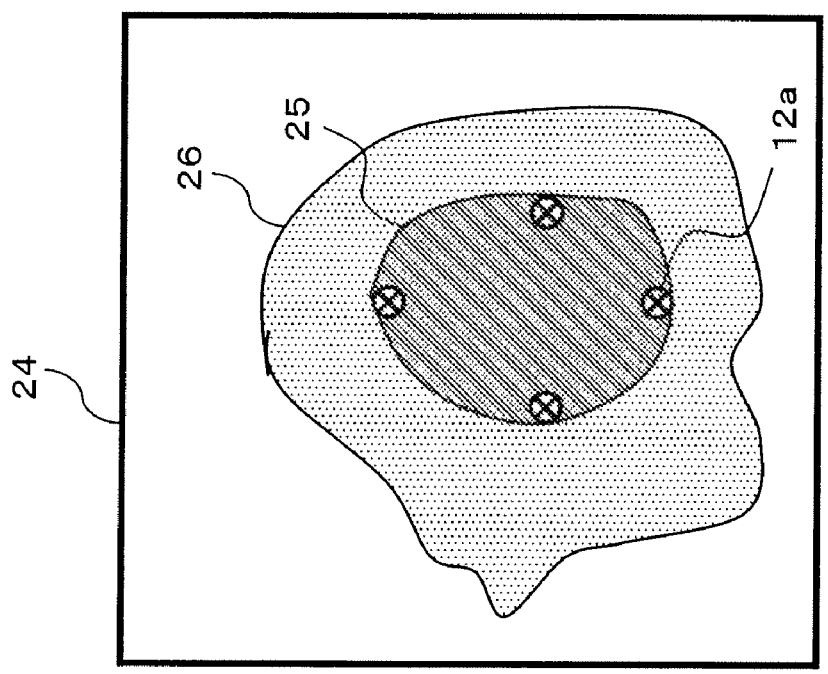
FIG. 16 is a diagram for describing a method for placing semiconductor devices on a semiconductor chip according to a twelfth embodiment of the present invention.

A method for placing semiconductor devices on a semiconductor chip according to a twelfth embodiment of the present invention will be described with reference to FIG. 16. FIG. 16 is a planar representation of results for simulation analyses on voltage fluctuations in a semiconductor chip 24, in which there are a plurality (in the figure, three) of regions classified in accordance with fluctuation values.

Where the highest and the next highest fluctuation values correspond to regions 25 and 26, respectively, any one type of the voltage fluctuation detection circuits described in the foregoing embodiments are placed within the region 25 with the highest fluctuation value. In the present embodiment, the voltage fluctuation detection circuits $12a$ according to the first embodiment are placed.

In general methods for placing the voltage fluctuation detection circuits, the voltage fluctuation detection circuits are conceivably placed at regular intervals or at random. To reduce a larger number of voltage fluctuation detection circuits, it is preferable to identify any locations where voltage fluctuations at a predetermined level or higher occur based on the results of simulation analyses on voltage fluctuations, and place the voltage fluctuation detection circuits at those locations.

Note that in a variant of the present embodiment, a similar effect can be achieved by clarifying the voltage fluctuation value per circuit block to be placed on the semiconductor chip 24, and placing the voltage fluctuation detection circuits at locations each adjacent to a location where any circuit block with a high voltage fluctuation value is placed.

Thirteenth Embodiment

Figure 17:
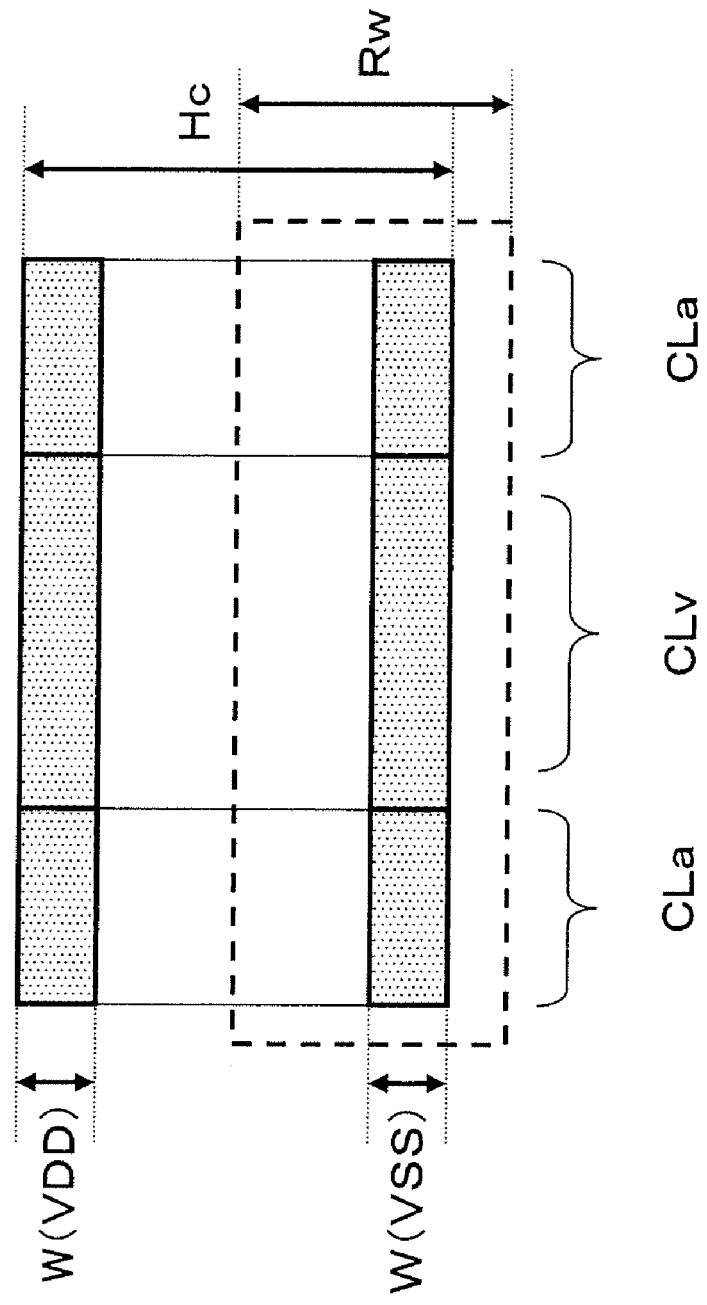
FIG. 17 is a diagram for describing a semiconductor device layout method according to a thirteenth embodiment of the present invention.

A semiconductor device layout method according to a thirteenth embodiment of the present invention will be described with reference to FIG. 17. FIG. 17 illustrates the placement of a voltage fluctuation detection circuit cell CLv and normal logic cells CLa on a semiconductor chip. The voltage fluctuation detection circuit cell CLv can be placed adjacent to the normal logic cells CLa, as shown in FIG. 17, by rendering the voltage fluctuation detection circuit cell CLv and the normal logic cells CLa equal in terms of any one or more of the following specifications: cell height Hc; position of power supply potential wiring W (VDD); position of ground potential wiring W (VSS); and position of well region Rw.

By employing the layout method in the present embodiment, it becomes possible to insert the cells according to an automatic placement and routing program without requiring any special attention even in the case of placing the voltage fluctuation detection circuits on a semiconductor chip.

Fourteenth Embodiment

Figure 18:
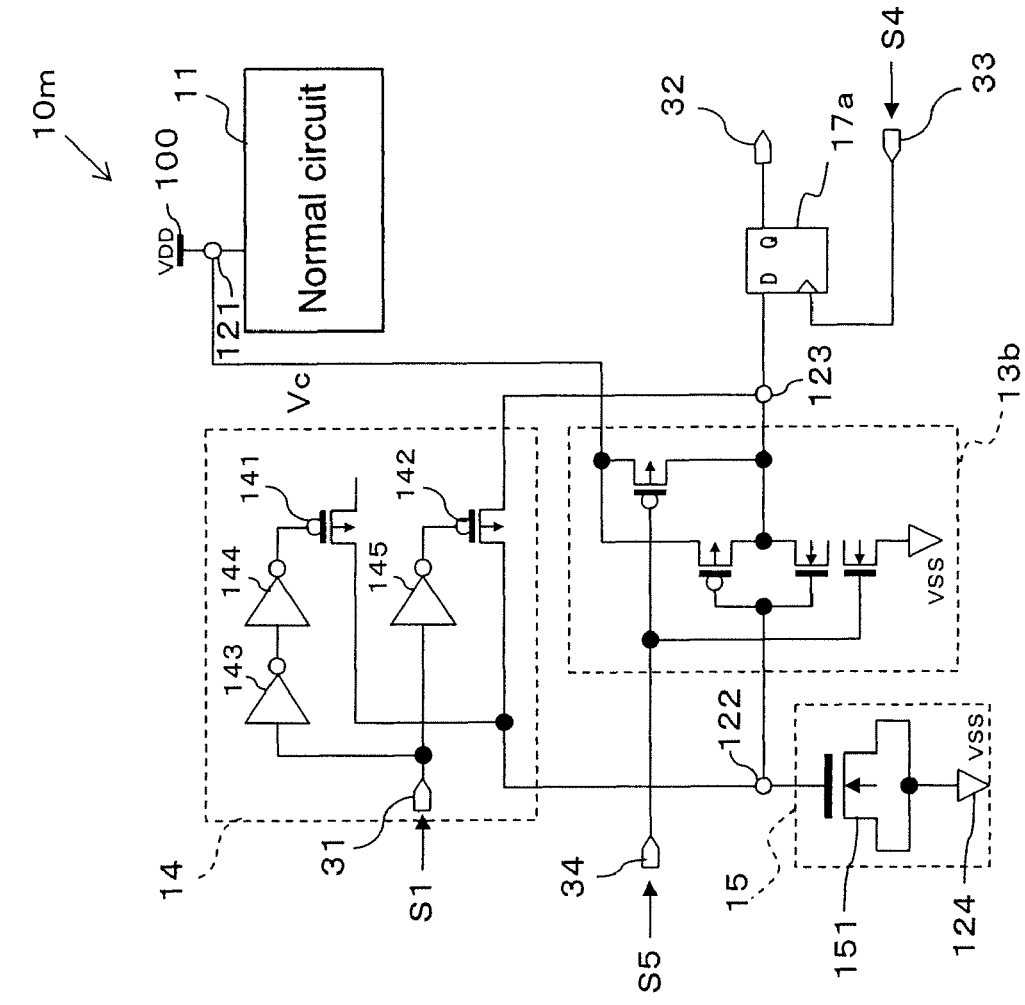
FIG. 18 is a circuit diagram illustrating the configuration of a semiconductor device according to a fourteenth embodiment of the present invention.

FIG. 18 is a diagram illustrating the configuration of a semiconductor device according to a fourteenth embodiment of the present invention. The semiconductor device 10m according to the present embodiment will be described with respect to concrete exemplary configurations of a switching element 14 and a capacitance element 15 as included in the semiconductor device 10e (FIG. 8) described in the fifth embodiment.

The switching element 14 includes P-type MOS transistors 141 and 142. The P-type MOS transistor 141 has a gate connected to two stages: inverters 143 and 144, while the P-type MOS transistor 142 has a gate connected to one stage: an inverter 145, such that signals at these gates are in reversed phases.

The P-type MOS transistor 142 has a source and a drain connected to an input terminal and an output terminal, respectively, of the inverting amplifier 13b. The P-type MOS transistor 141 has a source connected to the input terminal of the inverting amplifier 13b, and a drain which is in an opened state.

The above configuration is intended to reduce influence of the noise that occurs when the switch timing control signal S1 transitions between HIGH level and LOW level on the value of capacitance held in the capacitance element 15. Specifically, the P-type MOS transistor 142 functions as a switching element. The P-type MOS transistor 141 does not function as a switching element, but has such a function as to cancel the noise that occurs due to fluctuations in the gate voltage of the P-type MOS transistor 142 by fluctuations in the reverse-phased gate voltage of the P-type MOS transistor 141. As a result, it is possible to minimize errors in the value of the capacitance held in the capacitance element 15.

The capacitance element 15 includes an N-type MOS transistor 151. The N-type MOS transistor 151 has a gate connected to the input terminal of the inverting amplifier 13b, as well as a source and a drain connected to the ground potential. With this configuration, it is possible to produce capacitance elements without using any process specialized for the capacitance elements.

Fifteenth Embodiment

Figure 19:
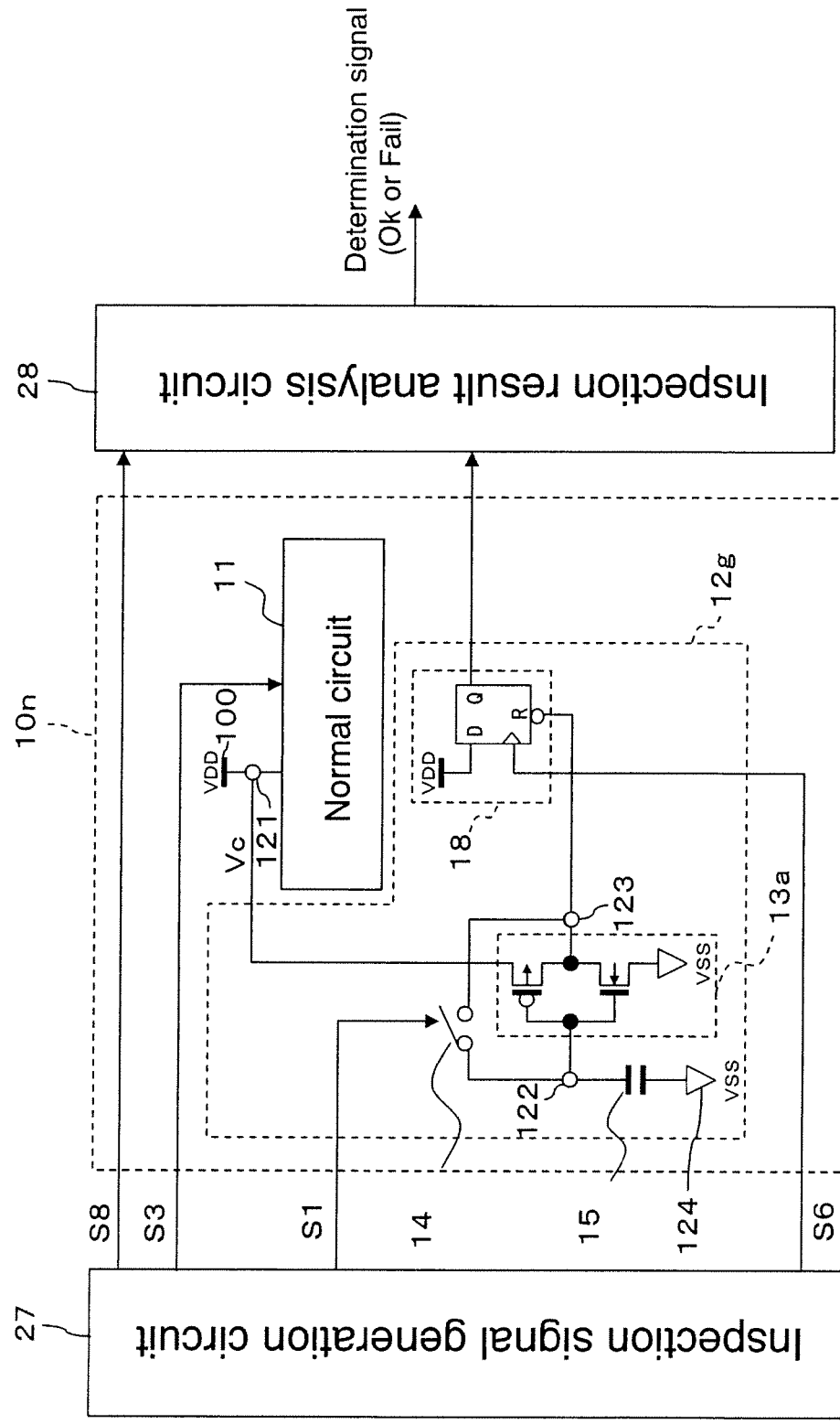
FIG. 19 is a circuit diagram illustrating the configuration of a semiconductor device according to a fifteenth embodiment of the present invention.

FIG. 19 illustrates the configuration of a semiconductor device according to a fifteenth embodiment of the present invention. The semiconductor device 10n according to the present embodiment is configured by adding an inspection signal generation circuit 27 and an inspection result analysis circuit 28 to the semiconductor device 10h (FIG. 11) described in the embodiment 8, and the semiconductor device 10n in its entirety constitutes an automatic inspection circuit.

In the foregoing embodiments, the control signals to be inputted to the semiconductor device are externally supplied to the semiconductor device, whereas in the present embodiment, various control signals are supplied from the inspection signal generation circuit 27. Similarly, in the foregoing embodiments, the user analyzes inspection results based on outputs from the voltage fluctuation detection circuit, whereas in the present embodiment, the inspection result analysis circuit 28 analyzes the inspection results based on the outputs from the voltage fluctuation detection.

The operation of the semiconductor device 10n according to the present embodiment will be described concretely. The inspection signal generation circuit 27 outputs the above-described control signals S1, S3, and S6, and also outputs a signal S8 to instruct the inspection result analysis circuit 28 to take in inspection results. Note that in the present embodiment, the control signal S2 (not shown) to control the power supply potential VDD is externally supplied to the semiconductor device 10n, but the control signal S2 may also be supplied from the inspection signal generation circuit 27.

The inspection result analysis circuit 28 receives an output from the voltage fluctuation detection circuit 12g, and the signal S8 for instruction to take in inspection results, and the inspection result analysis circuit 28 outputs a determination signal. If the power supply voltage Vc falls below the tolerable voltage Vc5 during the operation of the normal circuit 11, as described in the eighth embodiment, then the inspection result analysis circuit 28 outputs a determination signal "fail", and if otherwise, a determination signal "OK" is outputted.

The semiconductor device according to the present embodiment requires addition of an inspection circuit to the semiconductor chip. However, by prestoring in the inspection signal generation circuit 27 a program for outputting control signals with predetermined patterns, and furthermore, by setting expectation values for inspection results in the inspection result analysis circuit 28, the inspection only needs to confirm the determination signal. As a result, the inspection can be carried out efficiently.

Sixteenth Embodiment

Figure 20:
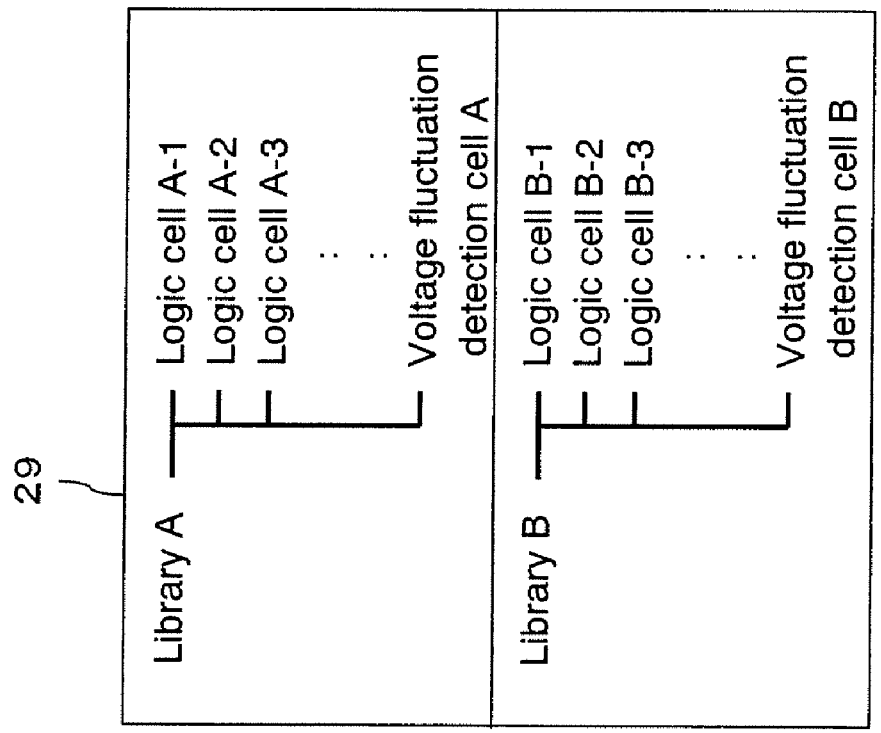
FIG. 20 is a diagram illustrating the configurations of libraries for semiconductor devices according to a sixteenth embodiment of the present invention.
Figure 21:
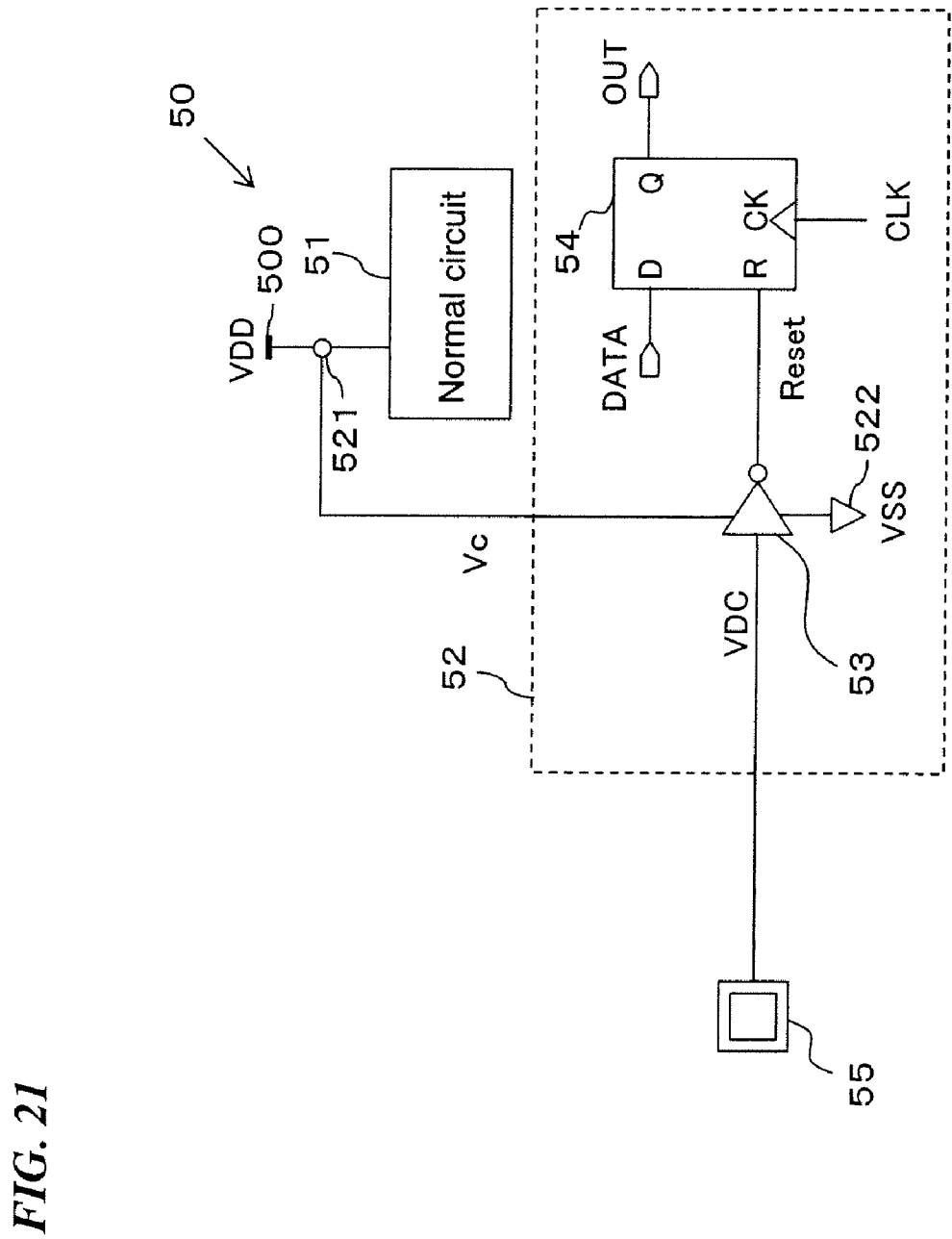
FIG. 21 is a circuit diagram illustrating the configuration of a conventional semiconductor device.

FIG. 20 is a diagram illustrating a set of exemplary cell libraries 29 for logic cells used for designing a semiconductor device of the present invention. In general, semiconductor chips are designed using cell libraries, and depending on purposes, a plurality of libraries are prepared in a database.

Two types of libraries A and B are prepared in the set of cell libraries 29 functioning as a database. Design can accord to the standards, such as cell height and width, based on each library. Cells in the same library can be placed adjacent to each other. By designing a logic cell and a voltage fluctuation detection cell using the same library in order to place them adjacent to each other, it is possible to connect power supply potential wiring and ground potential wiring, as illustrated in FIG. 17.

By designing the voltage fluctuation detection circuits used in the foregoing embodiments according to the standards based on the library, and prestoring the designs in the database, the designs can be used in a manner similar to other logic cells at the time of designing a semiconductor device. As a result, it becomes possible to carry out automatic design according to an automatic placement and routing program, leading to efficient mounting to a semiconductor integrated circuit.

The semiconductor device of the present invention is advantageous for use in semiconductor integrated circuits, such as LSIs, the scale of which is large and an operation inspection of which is time-consuming.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A semiconductor device comprising:
a normal circuit for use in a normal operation; and
a voltage fluctuation detection circuit for detecting fluctuations in a voltage applied from an external power supply to the normal circuit, wherein the voltage fluctuation detection circuit includes:
an inverting amplifier with first and second input terminals and an output terminal, the first input terminal being connected to wiring for connecting the power supply to the normal circuit;
a switching element connected between the output terminal and the second input terminal of the inverting amplifier, such that ON/OFF timing can be arbitrarily adjusted; and
a first capacitance element connected between the second input terminal of the inverting amplifier and a terminal to which a reference potential is supplied.

2. The semiconductor device according to claim 1, further comprising a holding circuit for holding a value with a sign of an output from the inverting amplifier.

3. The semiconductor device according to claim 1, wherein the output terminal of the inverting amplifier is connected to an amplifier.

4. The semiconductor device according to claim 2, wherein an amplifier is connected between the output terminal of the inverting amplifier and an input terminal of the holding circuit.

5. The semiconductor device according to claim 1, wherein the reference potential is a ground potential.

6. The semiconductor device according to claim 1, wherein the inverting amplifier is switchable between an operating state of outputting a comparison result for voltages at the first and second input terminals and an output fixing state of not outputting any comparison result for voltages at the first and second input terminals.

7. The semiconductor device according to claim 6, wherein the output fixing state of the inverting amplifier is a state where an output voltage of the inverting amplifier is equivalent to a potential of the power supply or the ground potential, or where an output from the inverting amplifier is at a high impedance.

8. The semiconductor device according to claim 1, wherein one of two terminals of a second capacitance element is connected to the second input terminal of the inverting amplifier, and the other terminal is grounded or connected to a second power supply for supplying the reference potential.

9. The semiconductor device according to claim 1, further comprising an output signal switching circuit connected to both the normal circuit and the voltage fluctuation detection circuit to output an output signal of either the normal circuit or the voltage fluctuation detection circuit.

10. The semiconductor device according to claim 1, further comprising a latching circuit having a reset input terminal connected to the output terminal of the inverting amplifier.

11. The semiconductor device according to claim 2, comprising a plurality of voltage fluctuation detection circuits, wherein the respective holding circuits of the voltage fluctuation detection circuits are flip-flops connected in a series, and outputs from the respective inverting amplifiers of the voltage fluctuation detection circuits are sequentially outputted from an output terminal via the flip-flops.

12. The semiconductor device according to claim 11, wherein the flip-flops and wiring connected between each of the flip-flops are also used for inspection of a plurality of the normal circuits.

13. The semiconductor device according to claim 10, comprising a plurality of voltage fluctuation detection circuits, and further comprising an AND circuit to which outputs from the voltage fluctuation detection circuits are inputted.

14. A method for testing a semiconductor device comprising a normal circuit for use in a normal operation; and a voltage fluctuation detection circuit for detecting fluctuations in a voltage applied from an external power supply to the normal circuit, wherein the voltage fluctuation detection circuit includes: an inverting amplifier with first and second input terminals and an output terminal, the first input terminal being connected to wiring for connecting the power supply to the normal circuit; a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied, the method comprising:
a first step of setting the normal circuit to an operating state, and setting the switching element to an ON state;
a second step of shifting the switching element from the ON state to an OFF state at a first arbitrary time; and
a third step of shifting the normal circuit from the operating state to a suspended state at a second arbitrary time, and setting a potential of the power supply at an arbitrary value to determine an output signal of the voltage fluctuation detection circuit.

15. The method according to claim 14, wherein the first through third steps are repeated while delaying the first arbitrary time in the second step by a predetermined time period, as well as changing the potential of the power supply in the third step at predetermined intervals.

16. A method for testing a semiconductor device comprising a normal circuit for use in a normal operation; a voltage fluctuation detection circuit for detecting fluctuations in a voltage applied from an external power supply to the normal circuit, wherein the voltage fluctuation detection circuit includes an inverting amplifier with first and second input terminals and an output terminal, the first input terminal being connected to wiring for connecting the power supply to the normal circuit; a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied; and a latching circuit having a reset input terminal connected to the output terminal of the inverting amplifier, the method comprising:
a first step of setting the normal circuit and the switching element to a suspended state and an ON state, respectively, and further setting an output of the latching circuit at an output level different from when a reset signal is inputted;
a second step of setting a potential of the power supply at an arbitrary value, and shifting the switching element from the ON state to an OFF state at an arbitrary time; and
a third step of shifting the normal circuit from the suspended state to an operating state, and determining an output signal of the latching circuit after the normal circuit operates for an arbitrary time period.

17. A method for placing a semiconductor device on a semiconductor chip comprising a normal circuit for use in a normal operation; and a voltage fluctuation detection circuit for detecting fluctuations in a voltage applied from an external power supply to the normal circuit, wherein the voltage fluctuation detection circuit includes an inverting amplifier with first and second input terminals and an output terminal, the first input terminal being connected to wiring for connecting the power supply to the normal circuit; a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied, the method comprising:
- a first step of performing a simulation analysis on voltage fluctuations in the semiconductor chip;
- a second step of identifying any location where voltage fluctuations at a predetermined level or higher occur based on a result of the simulation analysis on voltage fluctuations in the semiconductor chip; and
- a third step of placing the voltage fluctuation detection circuit at the location where the voltage fluctuations at the predetermined level or higher occur.

18. A method for placing a semiconductor device on a semiconductor chip comprising a normal circuit for use in a normal operation; and a voltage fluctuation detection circuit for detecting fluctuations in a voltage applied from an external power supply to the normal circuit, wherein the voltage fluctuation detection circuit includes an inverting amplifier with first and second input terminals and an output terminal, the first input terminal being connected to wiring for connecting the power supply to the normal circuit; a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied, the method comprising:
- a first step of performing a simulation analysis on voltage fluctuations in the semiconductor chip, and clarifying any circuit block to be placed on the semiconductor chip in which voltage fluctuations at a predetermined level or higher occur;
- a second step of identifying a location of the circuit block in which the voltage fluctuations at the predetermined level or higher occur; and
- a third step of placing the voltage fluctuation detection circuit at a location adjacent to the circuit block in which the voltage fluctuations at the predetermined level or higher occur.

19. A layout method for a semiconductor device comprising a normal circuit for use in a normal operation; and a voltage fluctuation detection circuit for detecting fluctuations in a voltage applied from an external power supply to the normal circuit, wherein the voltage fluctuation detection circuit includes an inverting amplifier with first and second input terminals and an output terminal, the first input terminal being connected to wiring for connecting the power supply to the normal circuit; a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied, the method comprising:
- rendering equal a logic cell for constructing the normal circuit and a voltage fluctuation detection circuit cell for constructing the voltage fluctuation detection circuit in terms of any one or more specifications selected from among cell height, position of power supply potential, position of ground potential, and position of well region, so that the logic cell and the voltage fluctuation detection circuit cell can be placed adjacent to each other.

20. A cell library for use in designing a semiconductor device comprising a normal circuit for use in a normal operation; and a voltage fluctuation detection circuit for detecting fluctuations in a voltage applied from an external power supply to the normal circuit, wherein the voltage fluctuation detection circuit includes an inverting amplifier with first and second input terminals and an output terminal, the first input terminal being connected to wiring for connecting the power supply to the normal circuit; a switching element connected between the output terminal and the second input terminal of the inverting amplifier, such that ON/OFF timing can be arbitrarily adjusted; and a first capacitance element connected between the second input terminal of the inverting amplifier and a terminal to which a reference potential is supplied, the cell library comprising;
- logic cells for designing the normal circuit, and
- voltage fluctuation detection cells for designing the voltage fluctuation detection circuit.

* * * * *